United States Patent [19]
Vora

[11] Patent Number: 5,340,762
[45] Date of Patent: * Aug. 23, 1994

[54] METHOD OF MAKING SMALL CONTACTLESS RAM CELL

[75] Inventor: Madhukar B. Vora, Los Gatos, Calif.

[73] Assignee: Fairchild Semiconductor Corporation, Santa Clara, Calif.

[*] Notice: The portion of the term of this patent subsequent to Mar. 31, 2009 has been disclaimed.

[21] Appl. No.: 822,390

[22] Filed: Jan. 16, 1992

Related U.S. Application Data

[60] Continuation of Ser. No. 701,542, May 16, 1991, Pat. No. 5,100,824, which is a division of Ser. No. 484,459, Feb. 15, 1990, Pat. No. 5,072,275, which is a continuation of Ser. No. 224,182, Jul. 22, 1988, abandoned, which is a continuation of Ser. No. 834,926, Feb. 28, 1986, abandoned, which is a continuation-in-part of Ser. No. 718,392, Mar. 27, 1985, abandoned.

[51] Int. Cl.$^5$ ............................................. H01L 21/70
[52] U.S. Cl. .......................................... 437/52; 437/31; 437/34; 437/48; 437/54; 437/59; 437/162; 437/200; 437/226
[58] Field of Search .................. 43/26, 31, 34, 40, 41, 43/52, 54, 56, 59, 162, 200, 228, 46, 47, 48, 60, 186, 51

[56] References Cited

U.S. PATENT DOCUMENTS

| | | |
|---|---|---|
| 3,777,364 | 12/1973 | Schinella et al. . |
| 4,069,067 | 1/1978 | Ichinobe . |
| 4,305,200 | 12/1981 | Fu et al. . |
| 4,343,082 | 8/1982 | Lepselter et al. . |
| 4,375,999 | 3/1983 | Nawata et al. . |
| 4,381,953 | 5/1983 | Ho et al. . |
| 4,384,301 | 5/1983 | Tasch, Jr. et al. . |
| 4,396,933 | 8/1983 | Magdo et al. . |
| 4,399,519 | 8/1983 | Masuda et al. . |
| 4,445,268 | 5/1984 | Hirao . |
| 4,450,620 | 5/1984 | Fuls et al. . |
| 4,453,306 | 6/1984 | Lynch et al. . |

(List continued on next page.)

FOREIGN PATENT DOCUMENTS

| | | |
|---|---|---|
| 0052450 | 5/1982 | European Pat. Off. . |
| 0054259 | 6/1982 | European Pat. Off. . |
| 0097595 | 1/1984 | European Pat. Off. . |
| 0110211 | 6/1984 | European Pat. Off. . |
| 0104616 | 1/1986 | European Pat. Off. . |
| 2640465 | 3/1978 | Fed. Rep. of Germany . |
| 80739 | 5/1982 | Japan . |
| 59-126672 | 7/1984 | Japan . |
| 60-039848 | 3/1985 | Japan . |
| 2021861 | 12/1979 | United Kingdom . |
| 2081507 | 2/1982 | United Kingdom . |
| 2134706 | 11/1983 | United Kingdom . |

OTHER PUBLICATIONS

Vora et al., Overhead Projections for a talk entitled "Advanced Bipolar Processes and Applications," date unknown.

(List continued on next page.)

*Primary Examiner*—Tom Thomas
*Attorney, Agent, or Firm*—Townsend and Townsend Khourie and Crew

[57] ABSTRACT

There is disclosed a static RAM cell and MOS device for making the cell along with a process for making the types of devices disclosed. The devices is an MOS device built in an isolated island of epitaxial silicon similar to bipolar device isolation islands, and has single level polysilicon with self-aligned silicide coating for source, drain and gate contacts such that no contact windows need be formed inside the isolation island to make contact with the transistor. The static RAM cell formed using this device uses extensions of the polysilicon contacts outside the isolation islands as shared nodes to implement the conventional cross coupling of various gates to drain and source electrodes of the other transistors in the flip flop. Similarly, extensions of various gate, source and drain contact electrodes are used as shared word lines, and shared Vcc and ground contacts.

5 Claims, 12 Drawing Sheets

U.S. PATENT DOCUMENTS

| | | |
|---|---|---|
| 4,462,149 | 7/1984 | Schwabe . |
| 4,481,524 | 11/1984 | Tsujide . |
| 4,484,388 | 11/1984 | Iwasaki . |
| 4,486,942 | 12/1984 | Hirao ........................ 437/59 |
| 4,497,106 | 2/1985 | Momma et al. ............. 437/59 |
| 4,507,847 | 4/1985 | Sullivan . |
| 4,519,126 | 5/1985 | Hsu . |
| 4,524,377 | 6/1985 | Eguchi . |
| 4,536,945 | 8/1985 | Gray et al. . |
| 4,569,123 | 2/1986 | Ishii et al. . |
| 4,593,454 | 6/1986 | Baudrant et al. . |
| 4,609,568 | 9/1986 | Koh et al. . |
| 4,613,885 | 9/1986 | Haken . |
| 4,621,276 | 11/1986 | Malhi . |
| 4,641,170 | 2/1987 | Ogura et al. . |
| 4,647,958 | 3/1987 | Gardner . |
| 4,656,731 | 4/1987 | Lam et al. . |
| 4,737,472 | 4/1988 | Schaber et al. ............. 437/59 |
| 4,743,564 | 5/1988 | Sato et al. . |
| 4,764,480 | 8/1988 | Vora . |
| 4,764,798 | 8/1988 | Kawabata . |
| 4,804,636 | 2/1989 | Groover, III et al. . |
| 4,821,085 | 4/1989 | Haken et al. . |
| 4,877,748 | 10/1989 | Havemann ................... 437/59 |
| 4,890,141 | 12/1989 | Tang et al. . |
| 4,891,328 | 1/1990 | Gris ............................. 437/59 |

OTHER PUBLICATIONS

Hodges et al., *Analysis and Design of Digital Integrated Circuits*, McGraw–Hill Book Company, 1983.

Millman, *Microelectronics*, McGraw–Hill Book Company, 1979.

Hamilton et al., *Basic Integrated Circuit Engineering*, McGraw–Hill Book Company, 1975, pp. 198–207.

Momose et al., "1.0–$\mu$m n–Well CMOS/Bipolar Technology," *IEEE Trans. Elec. Dev.* (1985) ED–32:2-71–223.

Beresford, "Special Report: IEDM Devices Meeting . . . ," *Electronics International* (1982) 55:132–145.

Chao et al., "High Capacitance Dynamic Random–Access . . . ," *IBM Tech. Disclosure Bulletin* (1983) 26:2597–2599.

Rideout, "Fabricating Low Resistance Interconnection Lines . . . ," *IBM Tech. Disclosure Bulletin* (1978) 21:1250–1251.

Muller et al., "A 256 kbit Dynamic RAM in 2 $\mu$m Polycide . . . ," *Siemens Forsch.-u. Entwickl.-Ber. Bd.* (1984) 13:202–207.

Chen et al., "A New Device Interconnect Scheme for Sub–Micron VLSI," *IEDM* (1984) pp. 118–120.

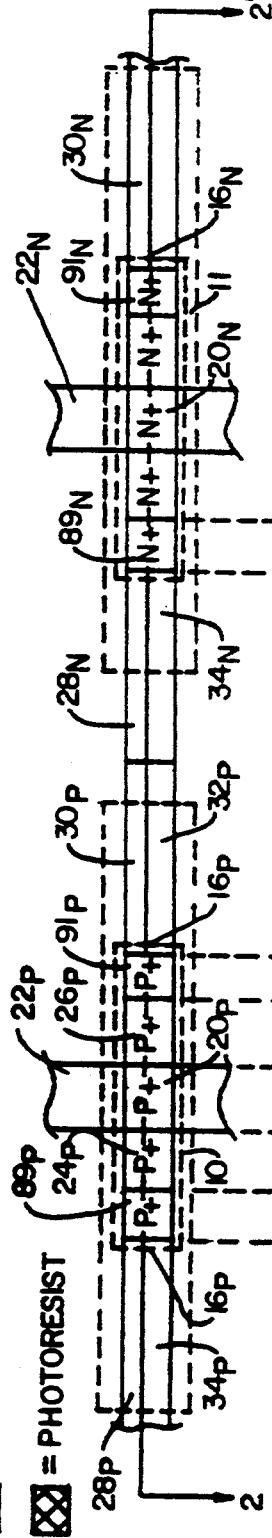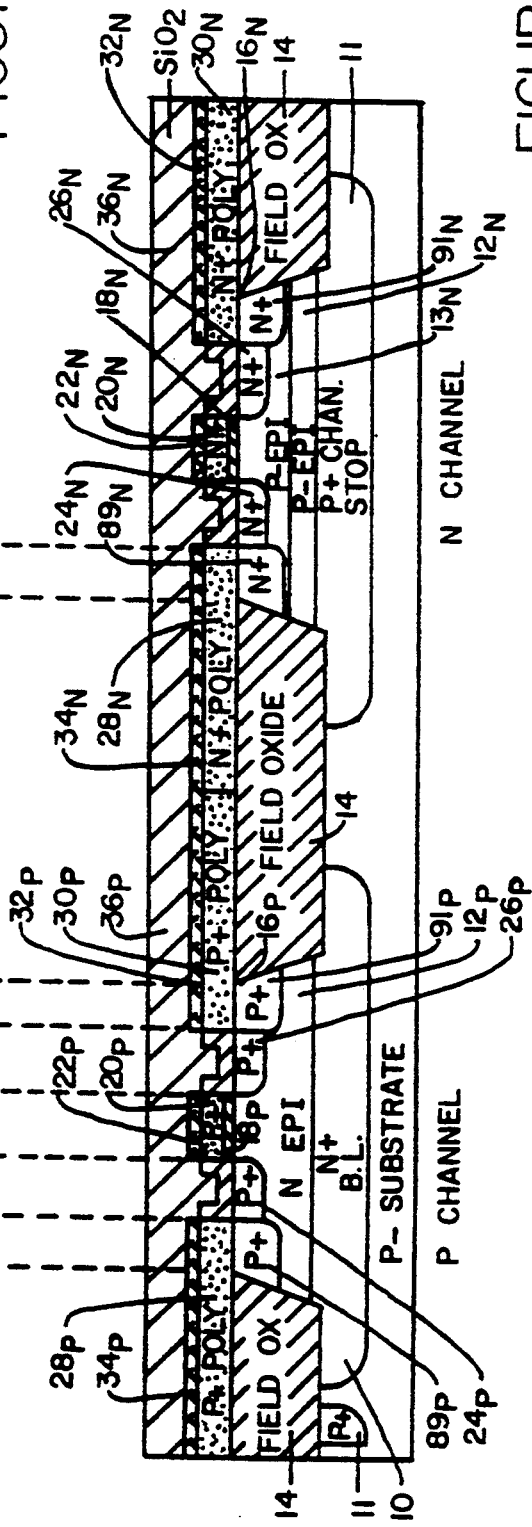

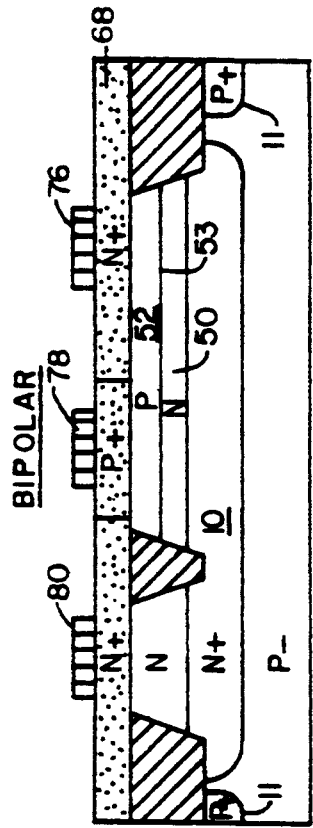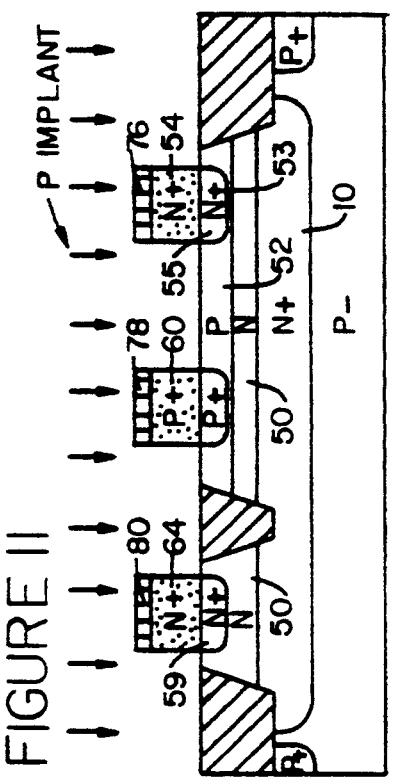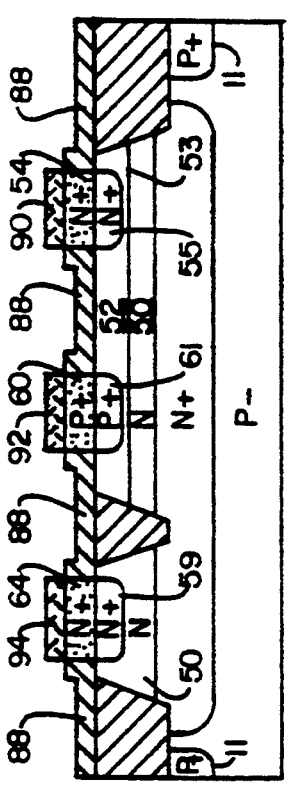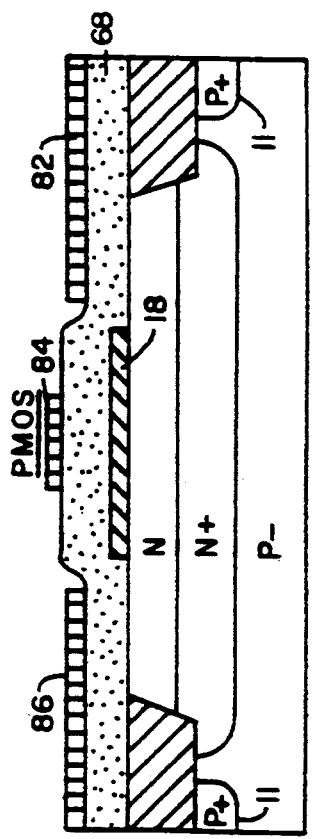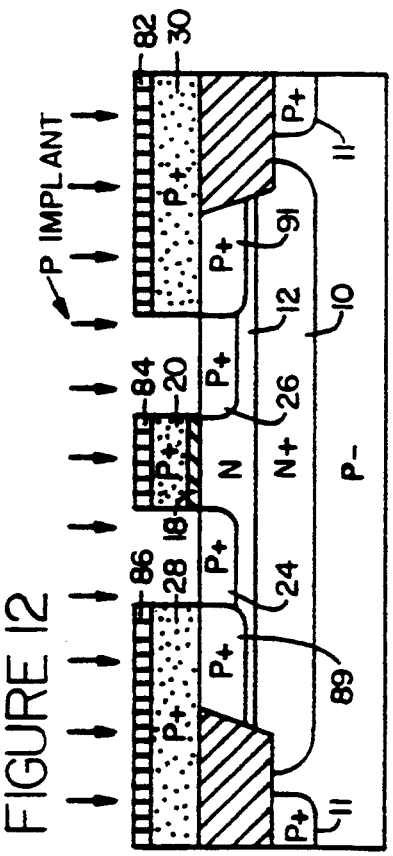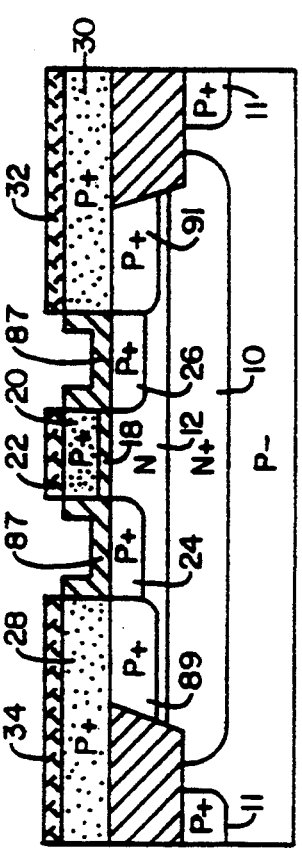

NMOS & CMOS PROCESS MODIFICATIONS

METHOD OF MAKING SMALL CONTACTLESS RAM CELL

CROSS-REFERENCE TO RELATED APPLICATION

This is a Rule 60 continuation of U.S. application Ser. No. 701,542, filed May 16, 1991, now U.S. Pat. No. 5,100,824, which is a division of U.S. application Ser. No. 484,459, filed Feb. 15, 1990, now U.S. Pat. No. 5,072,275 which is a File Wrapper continuation of U.S. application Ser. No. 224,182, filed Jul. 22, 1988, now abandoned which is a File Wrapper continuation of U.S. application Ser. No. 834,926, filed Feb. 28, 1986, now abandoned which is a continuation-in-part of U.S. application Ser. No. 718,392, filed Mar. 27, 1985 now abandoned.

BACKGROUND OF THE INVENTION

The invention relates to the field of static RAM cells, and, more particularly, to the field of CMOS and MOS static RAM cells.

There is a general trend in the semiconductor industry to make ever more complex semiconductor circuits. The reason is what more complex circuits on single die mean fewer chips are needed to implement functions which reduces the package count. This increases reliability and decreases cost. One of the major trends is toward the use of microprocessors which execute programs stored in memory on data stored in memory. As the complexity of applications becomes ever greater, the software and data to be stored has become ever more voluminous requiring greater quantities of memory. When memory chips could store only 16K bits data and instructions, complex programs required many memory chips which substantially increased the cost of systems. The trend then has been to make memory cells ever smaller so that more of them can be fit on one die to reduce the cost of memory and increase the reliability of systems using memory.

One of the problems with extremely dense integrated circuit memories is heat dissipation. It is known that certain technologies such as bipolar, ECL and 12 L dissipate large amounts of heat in operation. Other technologies such as NMOS and CMOS use less power but are slightly slower because of greater capacitances associated with MOS devices. Of the MOS technologies, CMOS is well known to dissipate the least amount of power since one device is always "off" thereby limiting the current flowing through the other device which is "on". Thus it is very desirable to make memory cells out of CMOS devices, especially if the capacitance of the memory cell devices and interconnections can be minimized to maximize the speed-power product of the cell.

One way of reducing the capacitance of the cell is to reduce the size of the transistors therein to the minimum size permissible by the photolithographic process. Another way to reduce the overall capacitance of the memory cell is to reduce the overall size of the cell such that the interconnection runs between the devices are of minimum length. This reduces the capacitance between these interconnection conductors and overlying or underlying conductive regions separated from the interconnection conductor by an insulating layer.

One of the impediments to reducing the size of MOS devices is the necessity of making electrical contact with the source, drain and gate electrodes. Electrical contacts are generally made by forming the transistor electrodes and covering them with an insulating layer such as silicon dioxide. Contact windows are then etched through the overlying insulating layer by coating the oxide with a photoresist and exposing portions of the resist layer with radiation directed through a photomask interposed between the radiation source and the photoresist layer. The photoresist is then developed and used as an etch mask during a wet or dry etch process to protect the portions of the oxide that are not to be etched away. The etching process creates a hole through the oxide to the electrodes of the transistors. Then the photoresist is removed and a layer of metal is deposited on the oxide layer. This metal is deposited in the holes and makes contact with the electrodes. Another layer of resist and another mask are then used to form a pattern of conductors in the deposited metal to implement the desired circuit.

The difficulty with this approach in terms of making small transistors is that the contact windows can only be made as small as the smallest line width dimension D which the photolithography process can define. The transistor electrodes must have an area at least as large as that of the contact window to successfully fabricate such a device assuming no alignment errors will occur. In practice however, the transistor electrodes must be made larger than the contact windows so as to provide a clearance around the contact window location to allow for misalignment of the contact window mask with the locations of the electrodes. Thus the electrodes must be made much larger than they would need to be if there were no contact windows needed for connection to the transistor.

Typically static RAM cells involve six transistors two of which must be cross coupled as a flip flop and two of which are connected to the flip flop as load devices. The last two are coupled to the flip flop as addressing devices with their gates coupled to the word line and their channels coupling the bit lines to the output nodes of the flip flop. Obviously there are many interconnections between the electrodes of the various transistors to other electrodes of other transistors. If each interconnection must be made through separate contact windows to the electrodes involved with a metal line running between the contact windows, it can be seen that the size of such a cell is going to be larger than is necessary if the connections could be made without using contact windows.

Accordingly, there has arisen a need for a small MOS device which can be built without contact windows and for a contact windowless memory cell of the static variety using CMOS technology.

Further, in memory design and in other areas of integrated circuit design, it is useful to be able to have both high performance MOS and high performance bipolar devices formed on the same integrated circuit substrate. MOS devices generally are smaller than bipolar devices, but bipolar devices are generally faster than MOS devices. These advantages can be usefully applied in many application areas. Specifically, in memory circuit design, it is useful to use the MOS devices to implement the portions of the circuit where transistors are most populous but where the speed requirements are more relaxed. Where speed is critical such as in the sense amplifiers and decoders, it is useful to be able to use bipolar devices as the operative elements to take advantage of their speed.

Unfortunately, heretofore, the processes that existed to make MOS and bipolar devices on the same die could only make high performance bipolar or high performance MOS transistors but not both on the same die. Accordingly, a need has arisen for a process that can allow the manufacture of both high performance MOS and high performance bipolar transistors on the same integrated circuit die.

SUMMARY OF THE INVENTION

The invention, in one important aspect, is a memory cell which uses very small MOS devices and no contact windows. The static RAM cell uses 6 CMOS transistors of a single poly construction, i.e., only a single layer of polysilicon is used in the construction of the device. The MOS transistor of the invention is built in an isolation island, and has no contact windows within the perimeter of the isolation island. The interconnections of the static RAM cell are accomplished by extending the polysilicon electrodes in contact with the source and drain areas to areas outside the perimeter of the isolation island of the particular transistor to which the electrode is associated. The polysilicon line can then be joined with the extension of the polysilicon electrode of the particular transistor contact or contacts to which it must be connected to complete the circuit. In other words, all the transistor contacts which must be coupled to each other are formed of one polysilicon conductor which is extended into the isolation island of each transistor involved and there forms the transistor contacts involved in the interconnection.

An important aspect of the invention which makes the small static RAM cell possible is the MOS transistor structure itself. The absence of contact windows within the perimeter of the isolation islands allows the devices to be made very small, and therefore allows the static RAM cell to be very small. With a two micron design rule process the static RAM cell can be 14×26 microns for a total area of 364 square microns. With one micron design rules, the static RAM cell size is 7×13 microns for a total area of 91 square microns Another important aspect of the invention is the process which allows the high performance MOS transistor structure to be built. An important aspect of this process is that it also allows high performance bipolar devices to be manufactured on the same die.

For simplicity and clarity the process will be first summarized as it exists to make high performance PMOS and high performance bipolar on the same die. The process can be summarized as follows (hereafter polysilicon may sometimes be referred to as poly and epitaxially grown silicon may sometimes be referred to as epi):

Form the buried layers under the bipolar devices and, preferably, under the MOS devices as well to provide better alpha particle protection, and form P+ channel stoppers under the field oxide around the isolation island;

Grow an epitaxial layer by low pressure chemical vapor deposition and dope it N type;

Form the isolation islands for the bipolar and MOS devices such as by an oxide/nitride sandwich deposition, mask and KOH etch followed by field oxidation or any other known method;

Do a P type impurity base implant in the N type epitaxial layer while masking the collector contact isolation islands of the bipolar devices and the MOS device channel regions (set the energy level to achieve the desired base width and set the dosage to achieve the desired base doping for good beta and breakdown voltage characteristics);

Planarize to remove the bird's heads formed in the isolation oxidation process for both the MOS and bipolar devices if said process is used;

Form a gate oxide insulating layer over only the channel regions of the MOS devices while masking off the active regions of the bipolar devices so that no oxide is grown there;

Deposit a layer of polysilicon over the whole surface of the wafer;

Implant the poly layer with both P and N type impurities using crude masks to form P+ and N+ areas in the poly layer where emitter, base and collector contacts are to be formed—mask off the MOS devices during the N type implant so that the poly over the MOS active region remains intrinsic for P channel devices but do not mask off the MOS devices during the P type implant for P channel devices such that the poly over the MOS active region becomes doped P+;

Deposit nitride and etch nitride to protect tops of poly regions which are to become the gate, source and drain contacts of the devices and the emitter, base and collector contacts of the bipolar devices (this mask defines the dimensions of the electrodes and should be set at the minimum line width D which can be successfully defined and reproduced using the process);

Etch polysilicon down to epi using etched nitride pattern as the etch mask to form desired poly contact stripes but do not remove nitride (note that this forms self aligned gate electrode with gate oxide);

Heat the structure in an oven at from 850 to 1000 degrees centigrade for approximately 30 minutes to drive impurities from the emitter poly contact stripe into the epi to form a shallow emitter region and to drive impurities from the source and drain and collector contact stripes into the epi to form good contacts (the preferred temperature is 950 degrees centigrade);

Do P type implant to form self aligned source and drain regions;

Form silicon dioxide over exposed areas of epi, and sides of poly stripes;

Etch the remaining nitride off the poly with an etching step that will attack nitride but not oxide;

Form a layer of refractory metal such as titanium over the entire surface of the wafer and heat treat to convert the metal in contact with poly into silicide;

Remove the unreacted metal over the oxide;

Planarize by any known technique such as by deposit of PVXII glass and reflow;

Form contact holes for metallization for any metal lines that must be used to interconnect cells to other circuits in the system; and Deposit a layer of metal and etch to form desired connectivity pattern.

A particular advantage of the process described above is that when the nitride is patterned to define the polysilicon contacts for the emitter, base, collector, source, drain and gate, any of these contacts may be defined to extend outside of the isolation island of its transistor. This extension of the poly outside the isolation island may be used to either form a contact pad for formation of a contact window or it may be extended over the isolation island of another transistor to form a shared node in the circuit. The result is a free interconnection layer, and consequent reduction in size of the circuit by elimination of contact holes to underlying structures for purposes of forming a connection between one node and another node in the circuit.

The modifications to the above process to allow high performance NMOS (and therefore high performance CMOS) and high performance bipolar transistors to be formed on the same die are as follows;

In step 4, if NMOS is to be formed on the same die, the NMOS isolation islands are exposed to a separate P type implant separate from the P type base implant to convert the N type epi to P type. All PMOS and bipolar isolation islands are masked during this implant.

- Alternatively and preferably, the NMOS islands may be converted to P type epi by omitting the N+ buried layer under the NMOS isolation islands and extending the P+ channel stopper implant under the NMOS isolation island before the epi is grown. During the field oxide growth step, the heat from the oxidation causes out-diffusion of the P type impurities up into the N type epi overlying the P+ channel stopper. Usually this outdiffusion falls short of the surface of the epi, so a P type implant is performed to bridge the gap and convert the thin layer of N type epi at the surface into P− type epi. The PMOS and bipolar isolation islands are masked during this implant.;
- In the step involving implanting of the poly layer, for the N channel devices, reverse the masking sequence specified above for the P channel devices for doping the poly;
- In step 12, mask off the NMOS device islands during the P type implant, and add an N type implant while masking off the bipolar and PMOS islands to form the self aligned NMOS source and drain regions;

BRIEF DESCRIPTION OF THE DRAWINGS

FIG. 1 is a top view of contactless P channel and N channel MOS transistors of the invention which can be used in the memory cell of the invention and which are manufactured using the process of the invention.

FIG. 2 is cross sectional view of the devices of FIG. 1.

FIG. 11 shows the bipolar device after nitride deposit and etch.

FIG. 12 shows the MOS device after the nitride deposit etch.

FIG. 13 shows the bipolar device after the poly etch and selective oxidation steps.

FIG. 14 shows the MOS device after the poly etch and selective oxidation.

FIG. 15 shows the bipolar device after nitride etch and silicide formation.

FIG. 16 shows the MOS device after nitride etch and silicide formation.

DETAILED DESCRIPTION OF THE PREFERRED EMBODIMENT

DEVICE STRUCTURE

Figure 4:
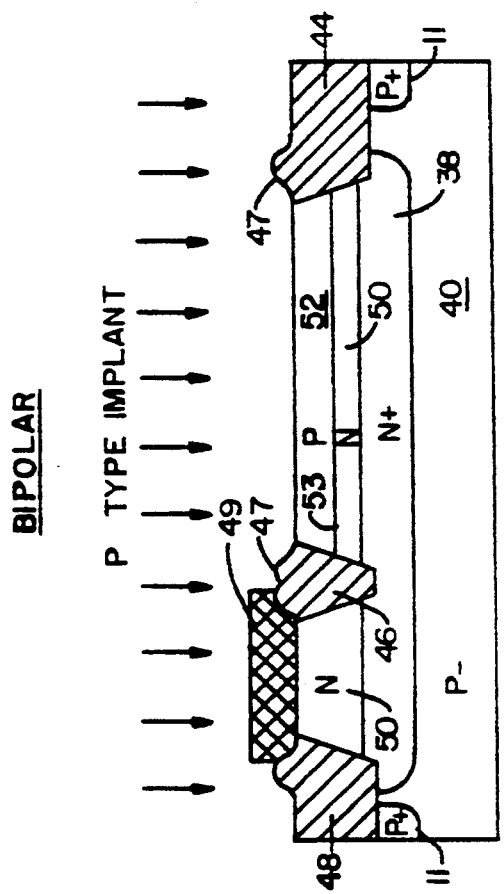
FIG. 4 shows a cross sectional view the bipolar transistor during an early stage in the process of the invention.

Before a description of the static RAM cell of the invention is made, it is appropriate to discuss the structure of the MOS transistors of the invention used in constructing the cells of the invention. These N and P channel MOS transistors are built in isolation islands, and they use no contact windows within the perimeter of the isolation island of each device. As a result these MOS transistors are very small since the physical area of the contact window for each of the gate, source and drain electrodes is eliminated as is the area consumed by the alignment clearance around the window. FIG. 1 shows a top view of two such contactless MOS transistors, one P channel and one N channel having their sources and drains connected together by the same silicide coated polysilicon layer which is used to make contact with the source and drain regions in the substrate of the N channel and P channel transistors (sometimes hereafter referred to as devices).

FIG. 2 shows a cross sectional view of the devices of FIG. 1 taken along the section line 2-2' in FIG. 1. Like structures in the P channel and N channel devices are indicated with like reference numerals except that an N or P subscript has been added to differentiate the structures by the device in which they are located. In the drawings which follow which describe the process of the invention for making these devices, the structures depicted in FIGS. 1 and 2 are given identical reference numerals except that the subscript is omitted since only fabrication of a P channel device is depicted in the process sequence figures.

The process steps to make the P channel device depicted in FIG. 1 and 2 will be described below in a process which is suitable for making both high performance CMOS and high performance bipolar devices on the same integrated circuit die. Although the process steps are described only in terms of the steps to make a P channel device, there will also be given descriptions of modifications which would be necessary to manufacture N channel devices.

For simplicity in discussing FIGS. 1 and 2, only the P channel transistor will be discussed since the discussion of the P channel device is equally applicable to the N channel device with a few exceptions which will be separately discussed. The contactless MOS transistor of the invention is formed over conventional buried layer 10 which is formed in a conventional manner. The buried layer is optional for PMOS as it only functions to provide better alpha particle protection which may be provided in other ways as well. In FIGS. 1 and 2, the buried layer 10 extends completely under only the P channel device. A P+ channel stopper 11 is included under the field oxide 14 of each P channel transistor. The P+ channel stopper is extended to completely underlie the isolation island of all N channel devices for reasons which will be made clear below in a description of the NMOS process modifications. In the preferred embodiment, this P+ channel stopper is used and is necessary to convert the N type epitaxially grown silicon to P— in the island of the NMOS devices to create the proper conductivity substrate for NMOS channel formation.

The buried layer 10 is not absolutely necessary to make a working MOS transistor, but its presence is preferred to provide better alpha particle immunity. Alpha particles are charged particles which can enter the structure from the surrounding environment. Their presence is a problem in very small memory circuits because in very small structures such as memory cells, the charge on the particle, if bled into the circuit, sometimes changes the electrical state of the circuit and can even change a logical 1 stored in a memory cell to a logical 0 or vice-versa. The presence of the highly conductive buried layer provides alpha particle protection, because the particles generally penetrate the structure deep enough to contact the buried layer, and the charge on the particle then drains off harmlessly into it. The buried layer is generally grounded since it is in electrical contact with the P— substrate which is grounded in many embodiments. In alternative embodiments, alpha particle protection can be provided by using a P+ doped substrate with P— doped epi grown over it. The P— epi can be selectively doped N— in areas where it is desired to form P channel devices. Of course alpha particle protection is not as significant a need in static memory cell design as in dynamic memory cell design, but the foregoing discussion details how this protection can be provided essentially for free since a buried layer is necessary for the bipolar devices which are be made by the process.

The buried layer is generally N+ doped in bipolar processes to make NPN transistors but would be P+ doped if PNP transistors were desired. For alpha particle protection in MOS devices, it does not matter which dopant is used to form the buried layer. The process to be described herein is equally suitable for forming contactless, single poly bipolar transistors as well as contactless, single poly MOS transistors. The differences between the steps for forming the bipolar devices and the MOS devices will be discussed as they arise. Such bipolar devices can be manufactured on the same die as the MOS devices for use in implementing such auxiliary devices as sense amplifiers and decoders and other devices on the critical path. Such bipolar devices are faster than MOS devices, and can substantially improve performance when used in the critical path of the device.

An epitaxially grown layer 12 of monocrystalline silicon (hereafter "epi") is grown on the buried layer, and it is in this layer that the channel regions of the MOS devices and the active regions of the MOS and bipolar transistors will be formed. The isolation regions for the bipolar transistors are defined by thick field oxide regions 14 which extend completely through the epi layer 12 and form a complete enclosure around a portion of the epi layer thereby forming an isolated island of epi which is not in electrical contact with its neighboring isolation islands. In bipolar transistors and CMOS circuits, this isolation is necessary to prevent unwanted coupling of neighboring devices to each other. However, with MOS devices having only one channel type, such isolation regions are not necessary since MOS devices are self-isolating. Therefore, although field oxide regions 14 defining boundaries 16 of an isolation island are shown in the MOS device of FIGS. 1 and 2, their presence is not absolutely necessary for proper functioning of the device. If, however, bipolar and CMOS are to be made on the same substrate, the isolation islands represent a "free" way of avoiding the need to form a P type well for the N channel device. The isolation islands are free in the sense that they must be formed for the bipolar transistors, so it involves no extra steps to form isolation islands for the CMOS devices. For the static RAM memory of the invention, the field oxide isolation is necessary since both N channel and P channel devices will be located in close proximity to each other. In the invention, the N type epi in the isolation island of N channel device is changed to P— type epi either by an implant or by outdiffusion from the P+ channel stopper 11 to enable formation of an N channel device. This P— type epi is shown at $13_N$ of FIG. 2.

Positioned above the epi layer 12 and within the confines of the isolation island is a layer of gate insulating material 18 such as silicon dioxide. This layer serves to insulate a gate electrode 20 from a channel region of the epi layer 12 lying directly below the gate electrode 20. In the preferred embodiment, the gate electrode 20 is polysilicon doped to P+ conductivity for the PMOS devices and doped N+ for the NMOS devices. Of course this doping can be opposite if some other steps known to those skilled in the art are taken to adjust the thresholds to acceptable levels.

Positioned on top of the gate electrode 20 is a self-aligned layer of silicide 22 in electrical contact with the gate electrode. It is present to improve the conductivity of the gate electrode since silicide has a conductivity of about two ohms per square which is much better than the conductivity of doped poly.

On either side of the gate electrode 20 there are two P implanted regions 24 and 26 in the epi layer that serve as the source and drain regions of the device and which are self-aligned with the edges of the gate electrode in some embodiments. Contact to the source and drain regions 24 and 26 is made through two doped poly conductors 28 and 30. These poly conductors are etched out of the same poly layer which was deposited to form the gate electrode 20. For a P channel device, the gate electrode and the source and drain poly lines are P+ doped. Self aligned layers 32 and 34 of silicide are formed on top of the source and drain conductors 28 and 30 to improve their conductivity. The advantage of using polysilicon for the gate, source and drain electrodes is that it lends itself to self-aligned silicide formation processes and has a higher melting point than aluminum. Thus later high temperature steps in the process will not melt the conductors previously formed as would be the case if they were formed of aluminum.

Finally, a layer 36 of silicon dioxide or other insulator is deposited as by chemical vapor deposition over the entire structure to electrically insulate it from later metal layers that will be added for interconnection purposes and to protect the structure. Known methods and/or compositions can be applied to this silicon dioxide layer to planarize it so as to make later photolithography and metallization easier and more reliable. Planar structures are much more scalable, i.e., subject to redesign at smaller dimensions and with smaller clearances between features which are not supposed to touch each other. This is because there is less distortion caused by the optical depth of field problem in photolithographic light projection onto a planar surface than for light projection onto a surface with difficult, non-flat terrain features. That is, feature sizes and shapes do not distort much when projected onto planar surfaces whereas depth of field problems cause distortion when features are projected onto a not-flat surface. This can lead to inadvertent touching of features which are not supposed to touch each other when the design is scaled down to smaller dimensions and clearances. Structures which are not planar are therefore more difficult to scale down in size and cannot be scaled down as far as planar technologies.

The structure of FIGS. 1 and 2 is more scalable than conventional MOS structures with metal source and drain contacts, because the contacts for the gate, source and drain are all on approximately the same level or layer of the circuit since they are fashioned out of the same poly layer. In conventional MOS structures, the gate is etched and a layer of insulation is then formed over the whole structure. Then contact windows must be etched through the insulating layer down to the source and drain regions and down to the gate electrode. These contact windows take up space, and they must must be properly nested over their respective electrodes. This nesting requires that certain clearances around the feature to be nested into a feature on a lower level be observed such that the aluminum which will later be deposited in the holes will not inadvertently contact structures which the aluminum is not supposed to contact. The alignment problems in performing this nesting become very difficult as the device sizes become smaller since for very small feature sizes, such as one micron, it is sometimes not possible to see alignment features even with the aid of microscopes. Further, even with a one micron process and with one micron design rules, a contact hole of one micron by one micron requires that the area over which is is being nested be larger than one square micron to provide for an adequate overlay tolerance. It is apparent then that transistor structures that require contact holes within the active area or within the perimeter of the isolation island of the device for contact to the terminals of the device must have physically larger dimensions than devices which do not require contact holes.

Both the MOS devices of FIGS. 1 and 2 plus bipolar devices of a single poly construction can be manufactured on the same die with the process described herein and none of the devices requires a contact hole within the perimeter of the isolation island of the device. The reason for this is that the electrodes that make contact to the specific regions of the transistors of the invention are made of doped polysilicon with overlying, self aligned silicide. These electrodes such as the source, drain and gate electrodes and the base and emitter electrodes of the bipolar devices may be etched such that they extend outside the perimeter of the isolation island of their particular transistors and extend over the field oxide to another node in the circuit such that a free interconnection layer at the transistor electrode level is provided. This saves much chip area which would otherwise be consumed by contact windows and the associated overlay tolerance between the layers to provide for nesting with adequate yields.

The process steps for manufacture of the two types of MOS devices versus those needed to manufacture a bipolar device are not identical, but there is enough overlap of the process steps needed for each type of device to render the two processes sufficiently compatible to be combined into one process having all the necessary steps. Of course some of the steps needed to make the MOS devices are not needed to make the bipolar devices and vice versa, but masking can be used to prevent unneeded steps from affecting the devices to which they do not apply. A side by side analysis of the processes will illustrate this point.

PROCESS SEQUENCE

Figure 3:
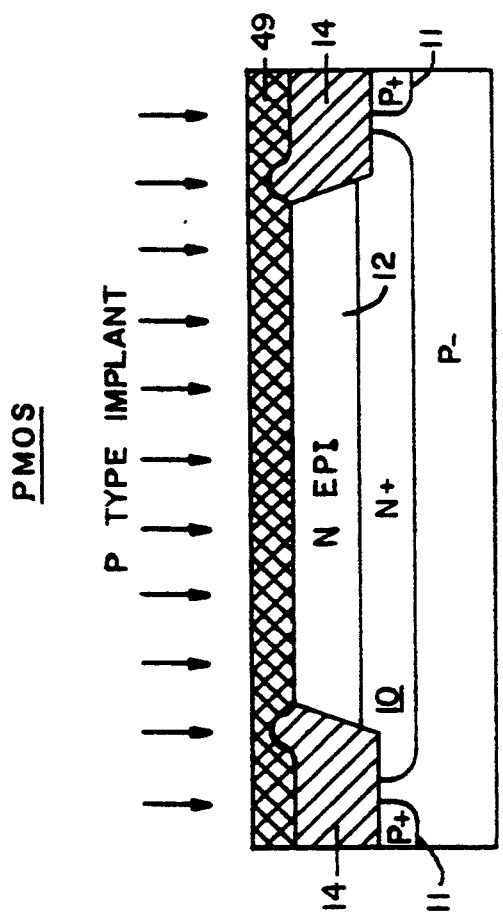
FIG. 3 shows, in cross section, an early stage of the PMOS transistor in the process of the invention.

The description of the process sequence which follows is for manufacture of PMOS and bipolar devices only. A later section will describe the modifications necessary to make NMOS, CMOS and bipolar devices on the same die. FIG. 3 shows a cross sectional view of the PMOS device of FIGS. 1 and 2 after the buried layer 10 has been formed, the epitaxially grown silicon layer 12 (hereafter epi) has been grown and an island of the epi has been isolated (hereafter the isolation island) by walls 14 of field oxide. The isolation island may be formed in any conventional manner, but preferably it is formed by the Fairchild Isoplanar TM process. This process is described in detail in U.S. Pat. No. 3,648,125 to Doug Peltzer. Isolation for MOS devices is not necessary, but, as noted above, there are certain advantages to using isolation islands for the MOS devices particularly where CMOS devices are to be formed on the same die.

Figure 5:
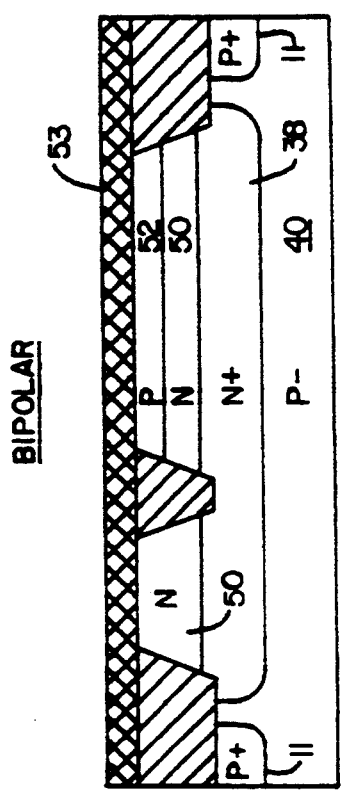
FIG. 5 shows, in cross section, an intermediate structure of the bipolar device after planarization has occurred.

In contrast, FIG. 4 shows, in cross section, an intermediate stage in the construction of a bipolar single poly transistor at approximately the same stage of completion as shown in FIG. 5 for the MOS device. FIG. 4 shows the bipolar device after the buried layer 38 has been conventionally formed in the substrate 40 and the epi layer 50 has been conventionally grown. Likewise, the field oxide regions 44, 46 and 48 have been conventionally formed to define an isolation island for the base and emitter regions and an isolation island for the collector region and collector contact. The base region 52 defines the active area of the transistor and a collector region comprised of the portion 50 of the epi layer defined by the field oxide regions 46 and 48 is connected by the buried layer 38 and the portion of the epi 50 between field oxide regions 44 and 46 to define a base-collector junction 53.

The conventional formation of the isolation islands leaves the bipolar structure as shown in FIG. 4 with small oxide protrusions 47 at the surface called bird's heads. These protrusions should be removed to maintain a planar structure. Processes for removing them are well known to those skilled in the art and will not be further described here.

To form the base regions of the NPN bipolar transistors, P type impurities can be implanted or otherwise added to the top regions of the epi layer 50 in the active region between field oxide regions 44 and 46 to convert it from N type to P type. This step can be done at this stage of the processing or after planarization, and can be omitted if PNP transistors are to be formed. Of course for NPN transistors, the collector regions must remain N type, so a layer 49 of photoresist must be deposited, masked and developed over the collector regions between field oxide regions 46 and 48 to protect the N type epi in the collector contact island from being changed to P type by the base implant. The PMOS device active regions must be protected from this P type base implant, because N type epi is needed under the gates for P channel devices. Thus, the photoresist layer 49 should be masked and developed to protect the active regions of all P channel MOS devices as shown in FIG. 3.

FIG. 5 shows the intermediate stage in the bipolar process after planarization has been done to remove the bird's heads at the surface of the field oxide regions. This planarization is not absolutely necessary, because the polysilicon to be deposited next will cover the bird's head with no problem of cracking etc. However, the planarization step does improve the later planarization of the structure after subsequent steps since the bird's heads structure will be echoed more or less in subsequent layers. The planarization step or steps can be any known planarization process such as that described in a pending U.S. patent application by Gregg Burton entitled "Bird's Head Planarization Process", Ser. No. 576,665, filed Feb. 3, 1984 which is hereby incorporated by reference.

Prior to growing the gate oxide 18, a planarization step should be performed on the MOS device field oxide bird's heads if oxide isolation is used to isolate the MOS devices. This planarization can be performed in identical fashion to the known planarization step used on the bipolar devices.

The next step is to grow a thin layer of gate oxide over what will be the channel regions of the MOS devices only. The isolation islands of the bipolar devices must be protected from this gate oxidation however. FIG. 5 illustrates the layer of photoresist 53 which is placed over the bipolar device isolation islands during the steps of the MOS process where the gate oxide is formed. This photoresist layer is deposited after the planarization and before the gate oxide growth.

Figure 6A:
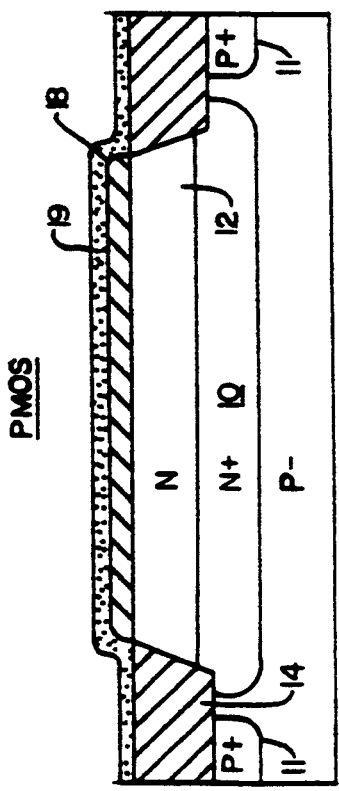
FIGS. 6a to 6c show the planarized intermediate stage of the MOS device after the gate oxide has been grown.

Referring to FIG. 6A, there is shown an intermediate stage in the process of forming the gate oxide. The first step in the process is to grow a thin layer of gate oxide 18. Typically, this gate oxide is thermally grown to a thickness of 250 angstroms. After the gate oxide 18 is grown, a thin layer of polysilicon 19 is formed by any conventional method to seal the thin gate oxide from impurities which might enter it from subsequent processing steps. Typically, this poly layer 19 is 500 angstroms thick, and is deposited by chemical vapor deposition. The formation of this poly layer 19 is not necessary, and is not critical to the operativeness of the process, however better yields will result if it is used.

Figure 6B:
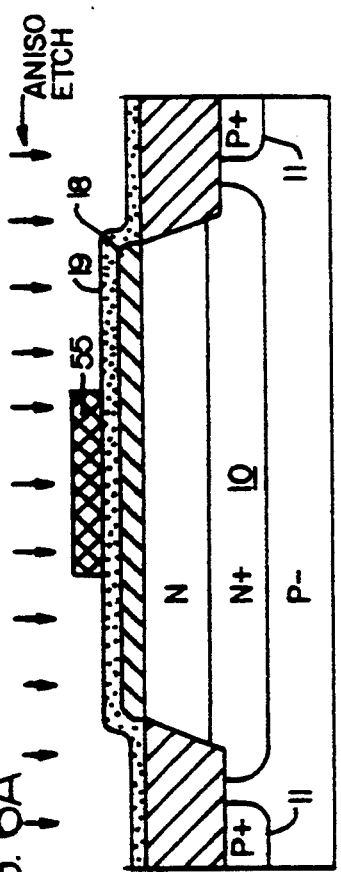
Figure 6C:
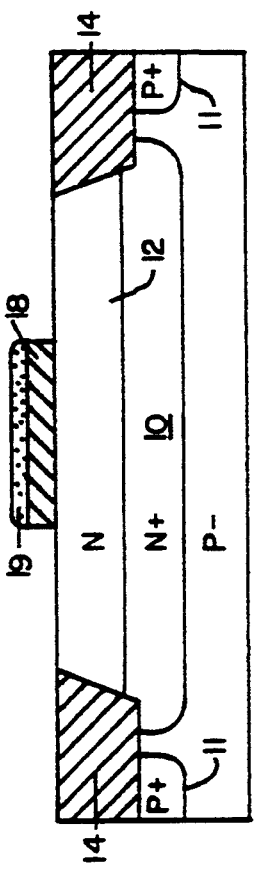

FIG. 6B illustrates the process of etching the gate oxide. This gate oxide must be formed only over the region of the isolation island which will be the channel region, and must be over the regions of the isolation island which will become the source and drain regions lest the source and drain contacts be insulated from the source and drain regions. To properly etch the gate oxide, a layer of photoresist is deposited, exposed to radiation and developed to form the etch mask 55 of photoresist over what will be the channel region. The photoresist mask 55 is then used as an etch mask during an anisotropic etch symbolized by the arrows in FIG. 6B. This etch vertically cuts through the poly layer 19 and the oxide layer 18 to define the gate oxide and polysilicon sandwich shown in FIG. 6C. FIG. 6C shows an intermediate stage of the MOS device after the resist that shielded the active regions of the P channel devices during the P type bipolar base implant is stripped off the wafer and after a thin layer of gate oxide 18 is grown and etched per the process of FIGS. 6A and 6B. The gate oxide should completely cover the portion of the active region which will be covered by the gate electrode, and, in the preferred embodiment, is made wider than the ultimate gate will be by the alignment or nesting tolerance of the design rules used to make the structure. All the bipolar device islands must be shielded by photoresist during the growing and etching of this gate oxide 18 as shown by FIG. 5.

Figure 7:
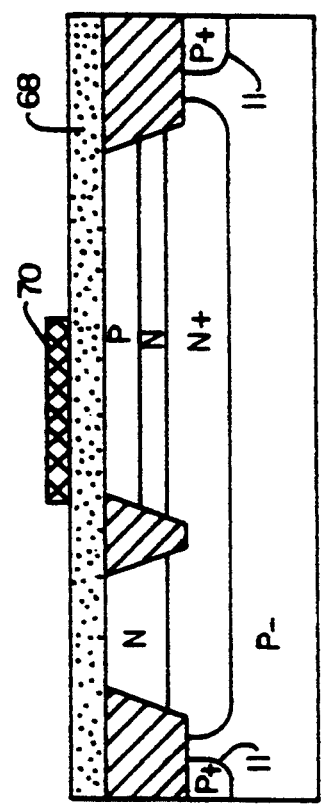
FIG. 7 shows the N type implant step into a layer of polysilicon previously deposited to form emitter and collector contacts for the NPN bipolar devices.

FIG. 7 shows an intermediate step in the bipolar process for doping a polysilicon layer 68 which has been deposited over the entire surface of the wafer. Emitter and collector contacts for the bipolar transistors will be formed from this layer 68 of polysilicon. The poly layer 68 can be deposited in any known manner such as by chemical vapor deposition. The poly should be doped N+ and P+ in the appropriate areas with impurities to further increase its conductivity to reduce the resistance of the contacts to be formed. This will be explained in more detail below.

Bipolar single poly transistors need contacts of N+ poly and P+ poly; N+ poly lines must be formed for the emitter and collector contacts, and P+ poly lines must be formed for the base contact. Therefore two separate implants must be made with portions of the poly layer 68 masked off during each of the implants. For example, a layer of photoresist 70, which has been imaged and developed with an N type implant mask, is placed over the portion of the poly which is to be implanted with P type impurities to protect this poly from the N type impurities in the first ion implantation. i.e., the poly base contact regions must be P+ in an NPN device, and so they must be shielded during the N type implant. This implant mask can be very crude, and its alignment is not critical since there is much tolerance for mask dimension and alignment errors at this stage of the process because the etching step to form the electrodes will cut away most of the poly layer 68 because the electrodes are not densely spaced. After the implant mask 70 is formed, the N type ion implantation step is performed with a low to medium energy implant. The thickness of the resist layer 70 must be such as to withstand the implant energy level.

Of course if polysilicon resistors are to be used in the design, then an N— implant must also be performed with its associated mask step. This implant may be done at this stage of the process. Also, if polysilicon diodes are to be used in the design, then these areas of the poly 68 should be implanted to form the desired functions between N+ and P+ regions.

Figure 8:
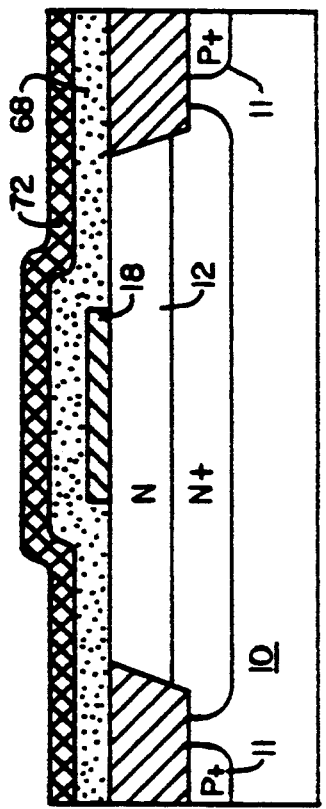
FIG. 8 shows the intermediate stage of the MOS device during the N type implant after the poly layer has been deposited.

FIG. 8 shows the MOS structure at an intermediate stage during the N type implant of FIG. 7. For a P channel device, P+ poly source and drain contacts are desired. Thus, the poly 68 over the MOS device must be shielded during the N type implant for the bipolar devices. To do this, a layer of photoresist 72 is deposited and developed over the layer of polysilicon 68. The P+ poly conductivity is typically 250 ohms per square.

Figure 9:
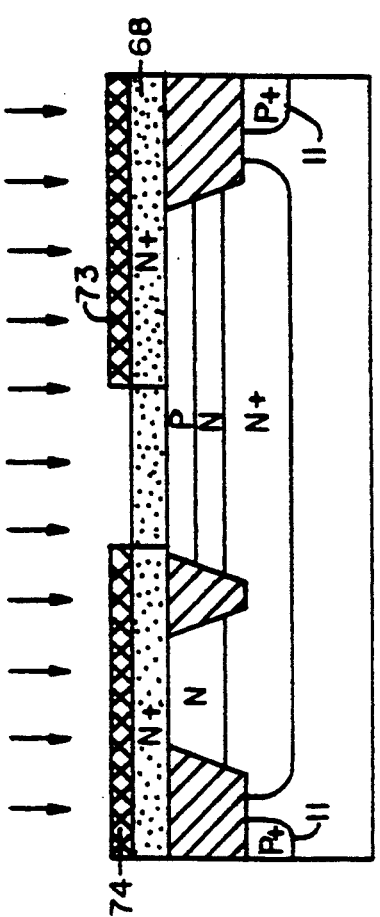
FIG. 9 shows the bipolar device during the P type implant of the polysilicon layer.

FIG. 9 shows the bipolar device during the P type impurity implant of the poly layer 68 to dope the region therein which will ultimately become the base contact for an NPN device. Another inexpensive mask whose alignment is not difficult is used to expose areas of a layer of photoresist which is deposited on the wafer to form photoresist layers 73 and 74 which cover the portions of the poly layer 68 which were previously doped N+. This P type implant dopes the region of poly between the photoresist layers 73 and 74 to P+ conductivity. Diffusion of impurities into the polysilicon 68 may also be used for the doping steps, but implanting is preferred.

Figure 10:
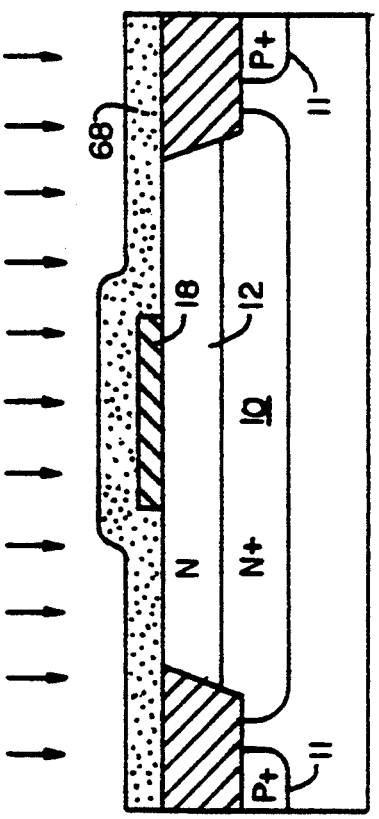
FIG. 10 shows the MOS device during the P type implant.

FIG. 10 shows the PMOS device during the P type impurity implant. The layer of photoresist 72 has been stripped off such that the poly layer 68 over the gate oxide and the active region are exposed to the bombardment of P type impurities to dope the entire poly layer 68 over the PMOS isolation island P+ in conductivity.

The polysilicon layer 68 in both the bipolar and the MOS devices must now be etched to form the various contacts to the device nodes. FIG. 11 shows an intermediate stage in this process for the bipolar devices, while FIG. 12 shows the same intermediate stage for the PMOS devices. To etch the poly, first a layer of nitride (not shown) is deposited over the entire poly layer 68. A mask is then used to expose a layer of photoresist (not shown) which is deposited over the nitride layer, and the photoresist is then developed to leave photoresist regions over the areas of nitride which are not to be etched away. This mask defines the dimensions of the electrodes and should be set at the minimum line width D which can be successfully defined and reproduced using the process. A wet etch solution of phosphoric or aqueous hydrofluoric acid is then used to etch away the portions of the nitride layer which are not protected by the photoresist. This leaves the structure as shown in FIG. 11 with regions of nitride 76, 78 and 80. Note that the regions of nitride 76, 78 and 80 left after the etch are positioned over what will become the portions of the poly layer 68 which will become, respectively, the emitter, base and collector contacts.

FIG. 12 shows the corresponding stage in the processing of the MOS devices. The steps are identical to those described above with respect to FIG. 11 for depositing and etching the nitride regions 82, 84 and 86. These regions of nitride are positioned over the portions of the poly layer 68 which will become the source, gate and drain contacts.

FIG. 13 shows the bipolar device after the poly etch and a heat drive-in step. After etching the nitride to the desired configuration of the bipolar device contacts as shown in FIG. 11, it is time to form the emitter, base and collector contacts and their respective out-diffused regions in the epi layer. This is done by using the nitride regions 76, 78 and 80 as etch masks for the poly layer 68. The poly can be either wet or dry etched in a known manner. Typical wet etching solutions include hydrofluoric acid, HNo3, acetic acid and KOH. This leaves the three poly strips 54, 60 and 64 as the emitter, base and collector contacts respectively.

After the poly etch of FIG. 13, in the preferred embodiment of the process the structure is baked in an oven to drive some of the dopants out of the polysilicon strips 54, 60 and 64 into the epi to form the emitter region 55, the base contact out-diffused region 61 and the collector contact out-diffused region 59. Preferably, this heat step is performed at 900 degrees centigrade for one-half hour, but those skilled in the air will appreciate variations in these times and temperatures which will also be effective. The exact times and temperature used may be determined by the user in accordance with the desired dopant concentration versus depth profile, and the resultant depth of penetration of the emitter region 55 and the desired base width for the region of the base region 52 between the emitter region 55 and the base-collector junction 53. These characteristics along with the base doping and the depth of penetration of the base implant of FIG. 4 define the switching speed and high frequency characteristics of the transistor, and, thus, may be adjusted by the user for his or her particular application. The use of this heat step is not critical to the operativeness of the process, and its use at this point in the process is not critical. The step may be omitted, since there will later be another high temperature bake to form intercontact stripe oxide layers 87 in FIG. 16 and 88 in FIG. 15. The out-diffusion described in this paragraph will also occur during the bakes of FIGS. 15 and 16, and this bake will serve the same purpose as the heat step defined in this paragraph.

FIG. 14 shows the stage in the processing of the MOS devices after the poly layer 68 is etched and a heat drive-in step is performed to form the source, gate and drain contacts. The nitride regions 82, 84 and 86 are used as poly etch masks for a wet or dry etch of the poly layer 68 to form the source, gate and drain contacts 30, 20 and 28. If a wet etch is used, an etchant such as hydrofluoric acid must be used that will also attack silicon dioxide so as to self-align the edges of the gate oxide 18 with the edges of the poly gate contact 20. An anisotropic dry etch is preferred. The etch must be stopped before substantial epitaxial silicon is removed. The poly etch step of FIG. 13 is the same as the poly etch step of FIG. 14, and the heat step performed at the stage symbolized by FIGS. 13 and 14 is the same for both the bipolar and the MOS devices.

Either before or after the heat step of FIGS. 13 and 14, a P type implant step is performed. The purpose of this implant is to form self aligned source and drain regions 24 and 26 in the PMOS device, and to lower the base resistance in the NPN bipolar device. In an alternative embodiment described below, this implant may be omitted here and done later after the intercontact stripe oxide layers 87 and 88 in FIGS. 16 and 15, respectively, are formed. The performance of the P type implant to form the source and drain regions 24 and 26 at the stage of the processing symbolized by FIGS. 13 and 14 is not critical to the operativeness of the process.

After the poly etch and the drive-in bake step, the nitride regions still remain on top of the poly. The exposed regions of the epi layer 12 and the sidewalls of the polysilicon contacts 30 and 28 and the sidewalls of the gate electrode 20 are then selectively oxidized by heat treating the wafer in an oxidizing ambient atmosphere. This forms a thin layer of thermal oxide over all the exposed epi and the sidewalls of the etched poly forming the transistor contacts. The resulting oxide is shown at 88 in FIG. 15 for the bipolar device and at 87 in the PMOS device.

The next step in the process is to remove the nitride "caps" on the poly and substitute self-aligned silicide "caps" for the nitride.

FIG. 15 shows the bipolar device after the nitride is etched away and a silicide layer is formed. The first step in forming the silicide caps is to remove the remaining nitride caps. The remaining nitride is etched away with an etchant that will attack nitride but not oxide. Such etchants are well known to those skilled in the art. After the nitride is removed, only the tops of the polysilicon contacts 54, 60 and 64 will be exposed and the sidewalls of these contacts which are normal to the surface of the epi layer 52 will be covered with thermal oxide. Next, a layer of titanium or some other refractory metal (the metal should be selected to minimize the resistance of the silicide which will eventually be formed) is deposited over the wafer surface. The refractory metal is typically sputter coated, but other methods may also be used such as CVD, molecular beam epitaxy or other methods to be developed in the future. The method selected should result in a commercially feasible deposition rate of metal with good coverage over all circuit features. Following the deposition of the refractory metal layer, a heat pulse silicide formation step is used to create silicide. The heat pulse step is well known to those skilled in the art. Preferably, it is done using the method described by Yun Bai Koh in a U.S. Pat. application entitled "Method For Controlling Lateral Diffusion of Silicon In a Self-Aligned Ti-Si$_2$ Process", filed Jul. 27, 1984, Ser. No. 634,937, now pending and commonly assigned the disclosure of which is hereby incorporated by reference. The silicide will be formed in self-aligned relationship with the top surface of the poly contact stripes only on top of the polysilicon contacts 54, 60 and 64 to form silicide contacts 90, 92 and 94. No silicide will be formed anywhere else, because silicide only forms where metal is in contact with single or polycrystalline silicon when heated. All areas, other than the areas on top of poly contacts 54, 60 and 64, are protected by oxide so no silicide forms on top of the oxide. After the silicide formation step, the remaining unreacted metal is not tightly bound to any oxide under it. This unreacted metal is removed in known fashion to leave the newly formed silicide cap in place and self aligned with the top of the poly contacts.

In an alternative embodiment of the process, the implant step of FIGS. 13 and 14 in the preferred embodiment may be omitted. In the alternative embodiment, after the removal of the remaining unreacted refractory metal, a P type impurity implant is performed to implant the surface of the base region 52 in the bipolar device of FIG. 15 with extra P type impurities and to form the source and drain regions 24 and 26 FIG. 16. The silicide regions 90, 92 and 94 and the poly underlying these regions serves as a mask for this implant. The implant energy must be such as to penetrate the oxide layer 88. The purpose of this implant in the bipolar device is to reduce the sheet resistance of the base region.

FIG. 16 shows the MOS device after nitride removal and silicide formation. The steps are identical to the steps described above with reference to FIG. 15. This leaves silicide regions 32, 22 and 34 on top of polysilicon contacts 30, 20 and 28 and self aligned therewith.

Figure 18:
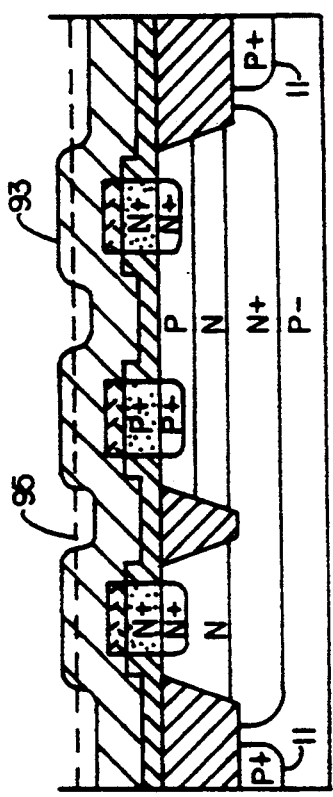
FIGS. 17 and 18 show the passivation and planarization steps for both the bipolar and the MOS devices respectively.
Figure 17:
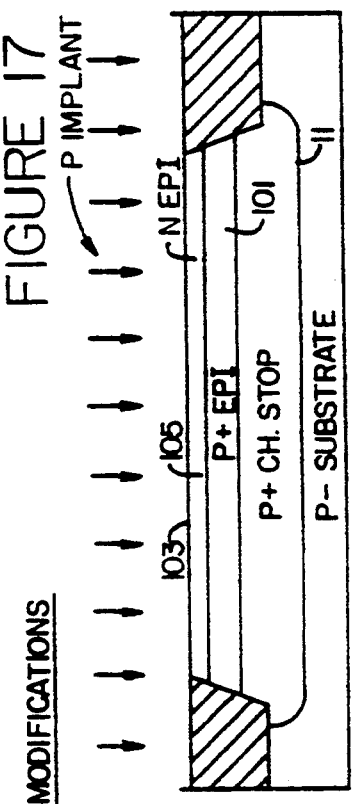

FIGS. 17 and 18 show the passivation and planarization steps for depositing a layer of insulation over the entire device and planarizing it. These steps are done in preparation for formation of metal lines over the devices to make contact with various contact pads below. Any method can be used and any compatible insulating material may be used to form the layer of insulation 93. In the preferred embodiment, insulation layer 93 is a layer of PVX II deposited by CVD or LPCVD. The composition of PVX II is well known to those skilled in the art as is its manner of deposition. The composition of this PVX II glass and its application are described in a U.S. Pat. No. 4,490,737 issued to John Pierce and William Lehrer which is hereby incorporated by reference. This glass has the property that its reflow temperature is lower than other conventionally used glasses because of the presence of germanium dioxide. Further, its thermal coefficient of expansion closely matches that of the structure below it so as to reduce the probability of cracking under thermal stress. After this glass is deposited, a heatpulse step is used to cause it to reflow and flatten the topography of the device to leave the flat surface 95. Of course other insulation materials may be used, and they may be planarized by any known method which is compatible with the structure from the standpoint of thermal cracking and electrical compatibility. Such planarization methods are well known to those skilled in the art. Caution should be taken to avoid temperatures and durations of any planarization heat step which are sufficient to cause the silicide "caps" to leach the dopants out of the underlying polysilicon contact stripes.

Note that the silicide coated poly layers can be used as the first layer of interconnects between the source, drain and gate of each MOS device and other nodes or transistor active regions in the circuit being defined by the user by extending the polysilicon and its silicide "cap" to any location outside the isolation island to form a contact pad, extend over another transistor isolation island or otherwise make contact with another conductor. The same is true for the emitter, base and collector poly/silicide contact stripes of the bipolar device.

Although static and dynamic RAM cells can be created without the need for metal contacts and contact windows to make the interconnections which form the cell itself, it is still sometimes necessary to make contact to various nodes in the cell for electrical communication to, for example a metal bit line or word line. Those skilled in the art will appreciate how this can be done by extending the appropriate polysilicon line and its silicide cap to a location over the field oxide and forming it into the shape of a contact pad of sufficient area to encompass a contact window or post type via plus an adequate nesting tolerance.

After the planarization step, photolithography processes can be used to cut contact holes at any locations where they are needed.

NMOS AND CMOS PROCESS MODIFICATIONS

As noted above, the process defined herein can also be used to make N channel MOS devices or CMOS comprised of both N channel and P channel devices on the same die either with or without using the process to make bipolar devices on the same die. Only the P channel and bipolar process steps have been illustrated above for brevity.

The following are the process steps to make N channel devices. These process steps will be illustrated in terms of the modifications that would have to be made to the masking illustrated in the figures illustrating the PMOS process where possible and separate figures are drawn where necessary. Those skilled in the art will understand that by following the processing steps illustrated in FIGS. 3–18 at certain locations on the die and by following the process steps detailed below at other locations on the die, it is possible to make a die with both high performance bipolar and high performance CMOS devices present at desired locations. Also, by eliminating the steps needed solely for making the bipolar devices, it is possible to use the process to make only high performance CMOS devices without making any bipolar devices.

Figure 19:
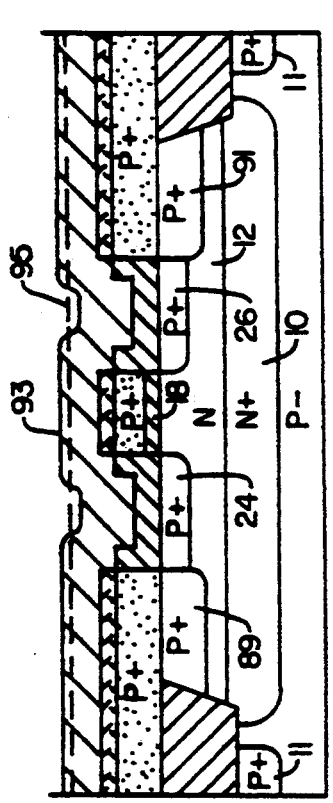
FIG. 19 shows an early step in one embodiment of a process modified so as to make both NMOS and bipolar devices on the same die.

To make a high performance N channel device in one non-preferred embodiment, the N+ buried layer 10 and N type epitaxial layer "epi" 12 are conventionally formed. Then the isolation field oxide regions 14 are formed in the same manner as for manufacture of a P channel device. This forms the buried layer needed for alpha particle protection of the N channel device and an isolation island to isolate it from any nearby P channel or bipolar devices. For N channel devices, P type epi is needed under the gates. In this embodiment, the NMOS device isolation islands are masked during the P type base implant shown in FIG. 4 for the bipolar device. However, after the base implant, the bipolar isolation islands are masked off, the PMOS islands are left masked off and the NMOS islands are unmasked. Then a separate P type implant is performed with dosage and energy levels which are compatible with the NMOS process as shown in FIG. 19. This converts the N type epi in the active regions of all N channel MOS devices to P type.

Figure 20:
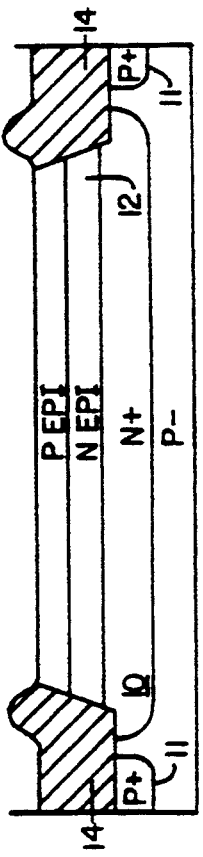
FIG. 20 shows the preferred step for converting N type epi to P type in a process modified so as to make both NMOS and bipolar devices on the same die.
Figure 21A:
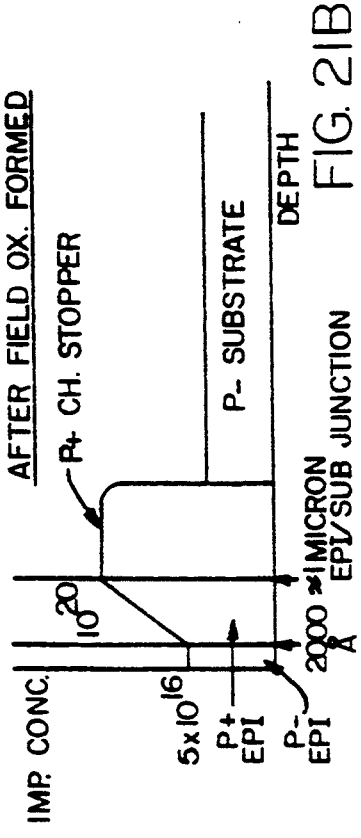
FIG. 21A shows a doping profile before the heat step in the step symbolized by FIG. 20.
Figure 21B:
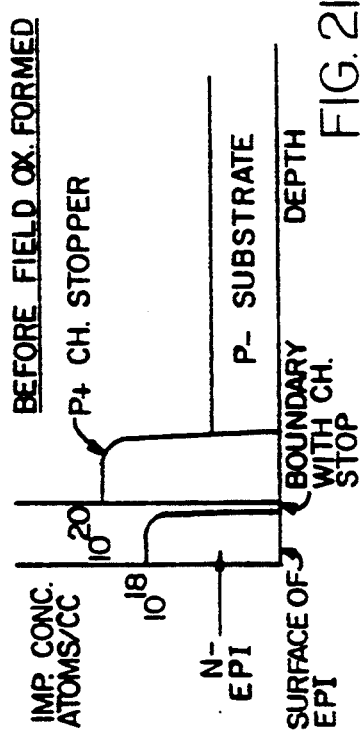
FIG. 21B shows a doping profile after the heat step in the step symbolized by FIG. 20.

However, the preferred embodiment utilizes a different technique to change the N type epi to P type for NMOS and CMOS devices. Referring to FIG. 20, in the preferred embodiment, the P+ channel stoppers 11 are extended under the isolation island of all NMOS devices instead of the N+ buried layer 10. This is done by implanting the P— substrate at selected locations before the epi layer is grown. The selected locations are defined by a mask which leaves exposed those areas of the substrate which are to become the P+ channel stopper rings around the bipolar and PMOS device islands and the entire region which is to be later covered by each NMOS device isolation island. This causes a P+ channel stopper having the configuration of the channel stopper 11 in FIG. 20 to be formed. Next, a layer of N type epi is grown over the entire wafer. After the epi layer is grown, the doping profile is approximately as shown in FIG. 21A. Following the formation of the epi layer, the isolation islands for the bipolar, PMOS and NMOS devices are defined by etching trenches through the epi layer and into the P— substrate around each area of epi which is to become an isolation island. This is done in any conventional manner, but the Peltzer process defined in the U.S. patent incorporated by reference earlier herein is preferred. Next these trenches are filled with field oxide which is, at least in part, thermally grown in a well known bake step. The heat from this field oxide formation bake step causes the P type impurities in the P+ channel stopper to out-diffuse from the P+ channel stopper and convert part of the N type epi 50 to P+ type epi as shown at 101 in FIG. 20. The epi layer is generally about one micron or 10,000 angstroms thick, and the P type impurities do not generally have the time to diffuse all the way to the surface 103 of the epi layer. Generally they fall about 2000 angstroms short of reaching the surface 103, and this leaves a layer of N type epi 105 at the surface. This layer 105 of N type epi is converted into P— type epi by a P type implant symbolized by the arrows in FIG. 20. During this implant, the PMOS and bipolar isolation islands are masked by photoresist to preserve their doping profiles. The dosage of this implant should be such as to control the final doping concentration of the epi layer 105 to be approximately $5 \times 10^{16}$ P type impurities per cubic centimeter. The energy level of this implant should be such that the P type impurities ions penetrate to the depth of the out-diffused P type impurities from the P+ channel stopper in layer 101, i.e., they should penetrate at least 2000 angstroms in the example cited herein. This leaves the doping profile in the isolation islands of the NMOS devices as shown in FIG. 21B.

Next comes the growth of the gate oxide and etching it to cover the channel region only. These steps are identical for PMOS and NMOS and are shown in FIGS. 6A through 6C. After the growth of the gate oxide, is the deposition of polysilicon layer 68 shown in FIG. 8 followed by an N type implant. To make an N channel device, the photoresist layer 72 would be absent over all isolation islands for N channel devices, but would be present for all PMOS islands. The N type implant for the NMOS devices can be the same dosage and energy level as the implant of FIG. 7 for the bipolar device. This results in an N+ doped polysilicon layer 68 from which the source, drain and gate electrodes can be formed. Typical N+ conductivity levels are 100 ohms per square while N— conductivity is typically 1000 ohms per square.

An implant of P type dopants is needed to form the bipolar devices since they need both N and P type polysilicon contacts, but this P type implant is not needed to form an N channel device. Thus, in FIG. 10 a photoresist layer would have to be added to protect the polysilicon deposited over all NMOS isolation islands.

Next, contacts must be formed in the polysilicon layer 68. To do this, the nitride layers 82, 84 and 86 in FIG. 12 must be deposited and patterned. This is done in an identical fashion as described with reference to FIG. 12 regardless of whether a P channel or N channel device is being formed. The polysilicon etch step is identical to the PMOS version as is the heat drive in step to drive in the N type impurities to form source and drain contact regions 89 and 91. The implant of FIG. 14 must not be performed on the NMOS islands however, so a photoresist layer is necessary over the NMOS islands to mask them from the P type implant of FIG. 14. A separate N type implant is them performed on the NMOS islands with the PMOS and bipolar islands shielded by a mask of photoresist to form the NMOS source and drain regions 24 and 26.

The selective oxidation is then performed on all islands after the photoresist masks are removed and before the nitride caps 82, 84, 86, 76, 78, and 80 are removed and the steps are identical for all islands. Following the selective oxidation to form the oxide layers 87 and 88, silicide formation of layers 32, 22, and 34 is performed after the nitride caps are removed. This is done in the same fashion as described in connection with FIG. 16 regardless of whether an N channel or P channel device is being formed.

Following silicide formation, an N type implant through the oxide regions 87 must be performed to form N+, self-aligned source and drain regions 26 and 24. Thus in FIG. 16, a layer of photoresist must be added to protect the N channel devices from the P type implant, and an extra N type implant (not shown) must be performed after uncovering all isolation islands to become N channel devices and covering all isolation islands to become P channel devices with photoresist.

That completes formation of the N channel device except for passivation, and etching of contact holes. These steps are identical to the steps described above with reference to FIGS. 17-18 regardless of whether an N channel or P channel device is being formed.

THE STATIC RAM CELL

Figure 22:
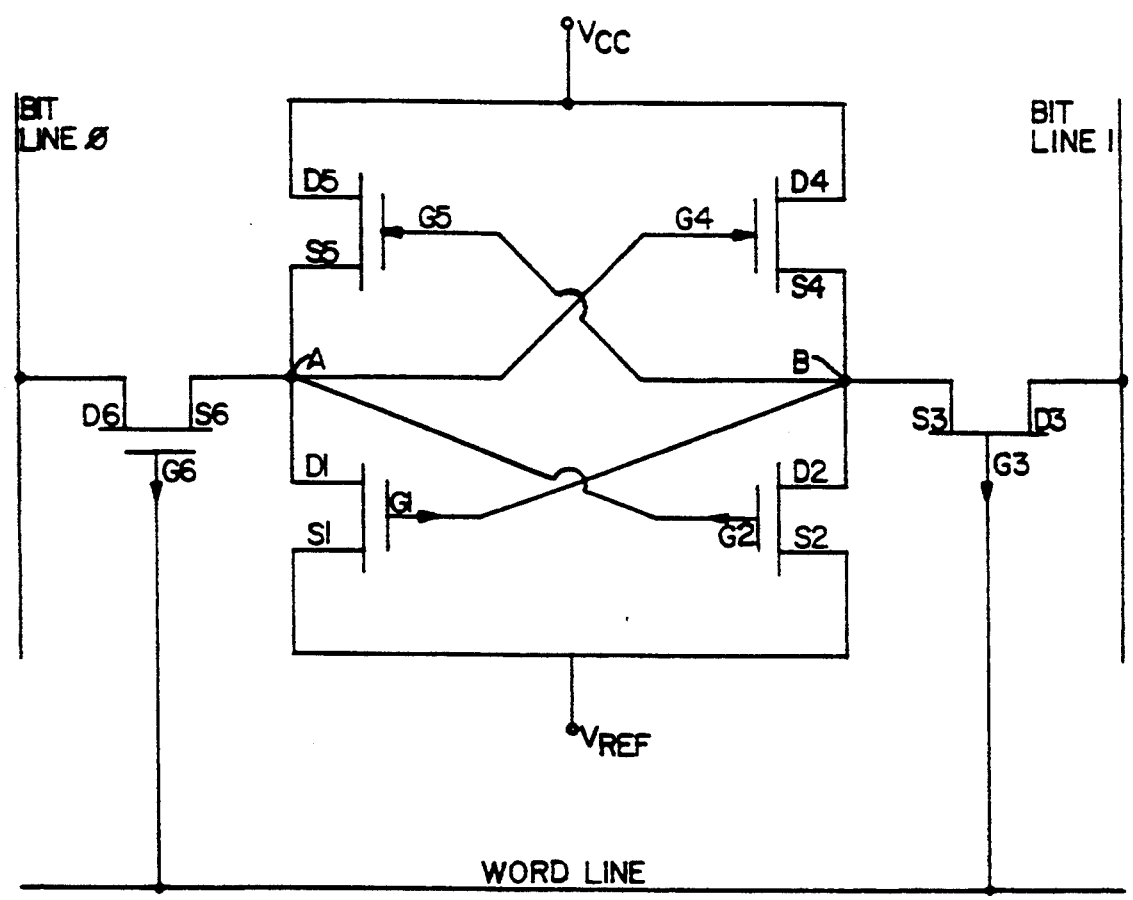
FIG. 22 is a schematic diagram of the circuit represented by the static RAM cell of FIG. 20.
Figure 23:
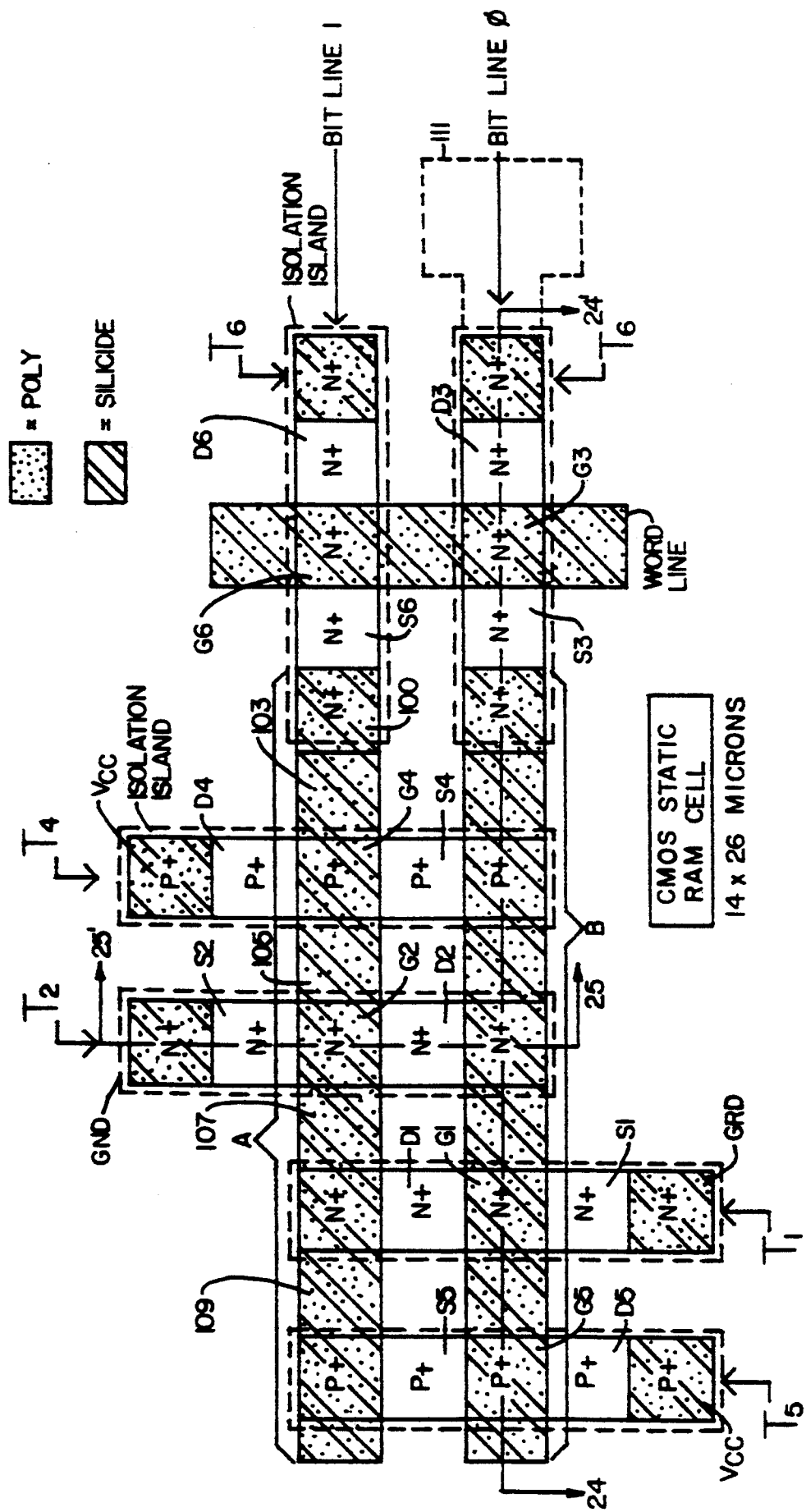
FIG. 23 is a top view of the layout of the static RAM cell of the invention.
Figure 24:
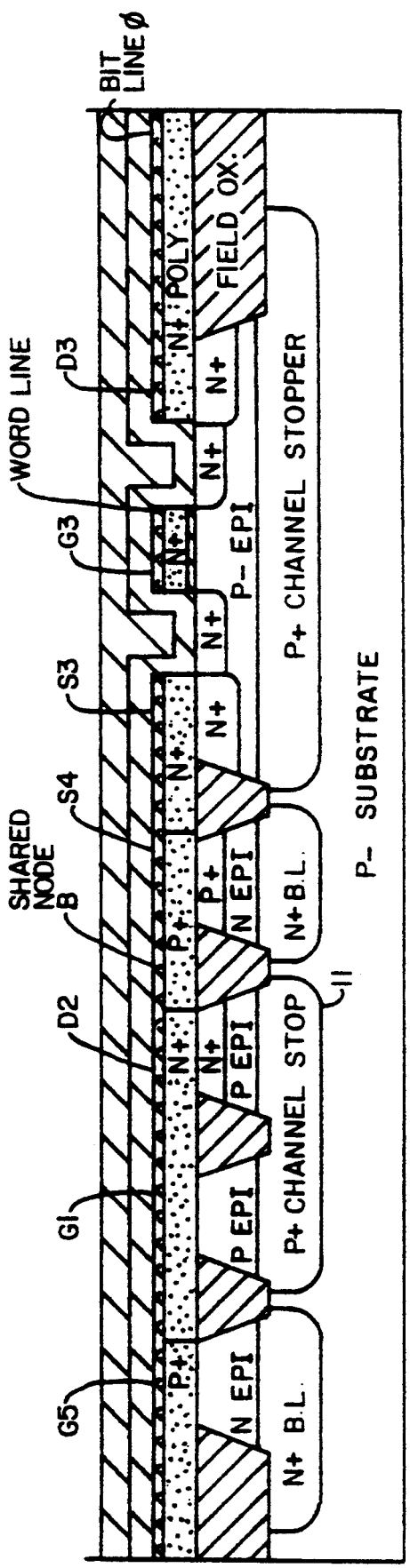
FIG. 24 shows a cross sectional view of
FIG. 20 along the section line 24-24'.
Figure 25:
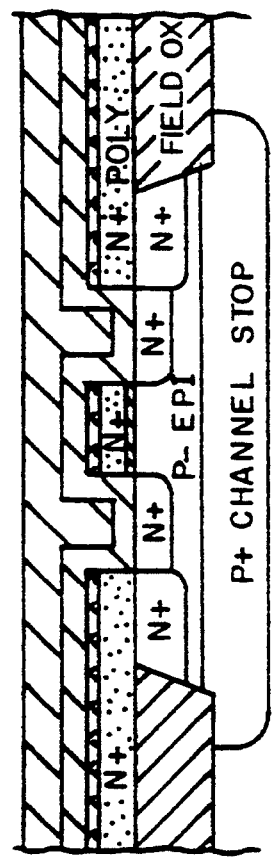
FIG. 25 shows a cross sectional view of the cell of FIG. 23 taken along the section line 25-25'.

Referring to FIGS. 22-25 there is shown a static RAM cell of the invention using CMOS transistors of the design described above. FIG. 22 shows the circuit implemented by the static RAM cell, and FIG. 23 shows the cell layout in a top view. FIGS. 24 and 25 show cross sections through the cell along the section lines 24-24' and 25-25' respectively in FIG. 23. Note the shared nodes A and B in FIG. 22. These multiple interconnections of many sources, gates and drains are all accomplished on the polysilicon/silicide level as will be seen from inspection of FIG. 23. Each transistor in FIG. 22 is numbered, and its source, gate and drain electrodes are numbered with a letter indicating the electrode type and a number corresponding to the transistor number for ease of mapping the various electrodes into the plan view of the cell layout given in FIG. 23. The circuit of FIG. 22 is not new, but the embodiment of it in the cell of FIG. 23 is new, and is smaller than prior art static RAM cells by virtue of its having no contact windows within the perimeter of the cell.

Turning to FIG. 23, the isolation islands of each transistor are outlined in phantom or dashed lines to identify the active areas of each transistor. Each source, gate and drain region is identified with the same letter and number as was used to identify it in FIG. 22. The shared nodes A and B are the long silicide covered polysilicon contacts marked A and B in FIG. 23. That is, the silicide covered poly contact 100 to the source of transistor 6 is connected to the gate G4 of transistor 4 by a silicide covered poly segment 103 which is really just an extension of the poly contact 100. Another silicide covered poly contact 105 which is an extension of the gate G4 makes the connection between the gates G4 and G2 corresponding to the line 101 in FIG. 22. Likewise the silicide coated polysilicon regions 107 and 109 make the contact between the gate G2 and the drain D1 and the drain D1 and the source S5 respectively. A similar situation exists for the shared node B. FIG. 24, which is a cross section of the cell along the section line 24-24' in FIG. 23 shows the manner of implementing the shared node B with greater clarity. Note how it is one long strip of silicide covered polysilicon with no need for contact windows and metal jumpers between transistor electrodes. It can also be seen that the conductivity and impurity type of the various epitaxial silicon layers in the various isolation islands changes from island to island in FIG. 24. This is implemented by selectively masking the various islands from the P type implant shown in FIG. 4 to create the proper impurity type for the channel regions of the various P channel and N channel devices making up the memory cell. FIG. 25 shows a cross section of the N channel device designated transistor 2 in FIG. 22.

The bit lines 0 and 1 of the cell are at the silicide/polysilicon level of the cell and can be silicide covered poly extensions of the contacts to the drains D6 and D3, or contact windows can be formed to these drain regions after the planarized insulation layer 93 is formed. If the drains are too small to form a contact window on, these polysilicon contacts can be extended to form contact pads. The same is true for the Vcc power supply terminals at the sources S1 and S2. Further, instead of contact windows formed at the locations of the contact pads, metal posts can be formed with their top portions flush with the planar surface 95 in FIG. 18. The formation of such metal posts is known to those skilled in the art and will not be described herein. The top of these posts can be in electrical contact with power and ground busses formed in metal on top of a first planarized insulation layer. Then another planarized insulation layer can be formed over these power and ground busses and further metal posts can be formed located at the locations of the bit line connections and extending through this second insulation layer. Metal bit lines can then be formed on top of this second insulation layer to be in electrical contact with the tops of the posts connected to the bit line contact pads and the drains D3 and D6. Alternatively, the bit lines can be formed on top of the first insulation layer, and the power and ground busses can be formed on top of the second insulation layer formed over the bit lines.

The word lines can be implemented completely at the silicide/polysilicon level simply by extending the gate poly of the transistor gates G3 and G6 in every cell in a row of an array to be one continuous conductor.

It will be noted that the doping of the polysilicon changes from N+ to P+ and back again as one traverses the length of the shared nodes A and B. This is easily accomplished by use of relatively inexpensive masks with relatively crude alignments corresponding to the masks 72 and 70 in FIGS. 8 and 7 respectively but formed so as to implement the patterns needed in FIG. 26.

Figure 26:
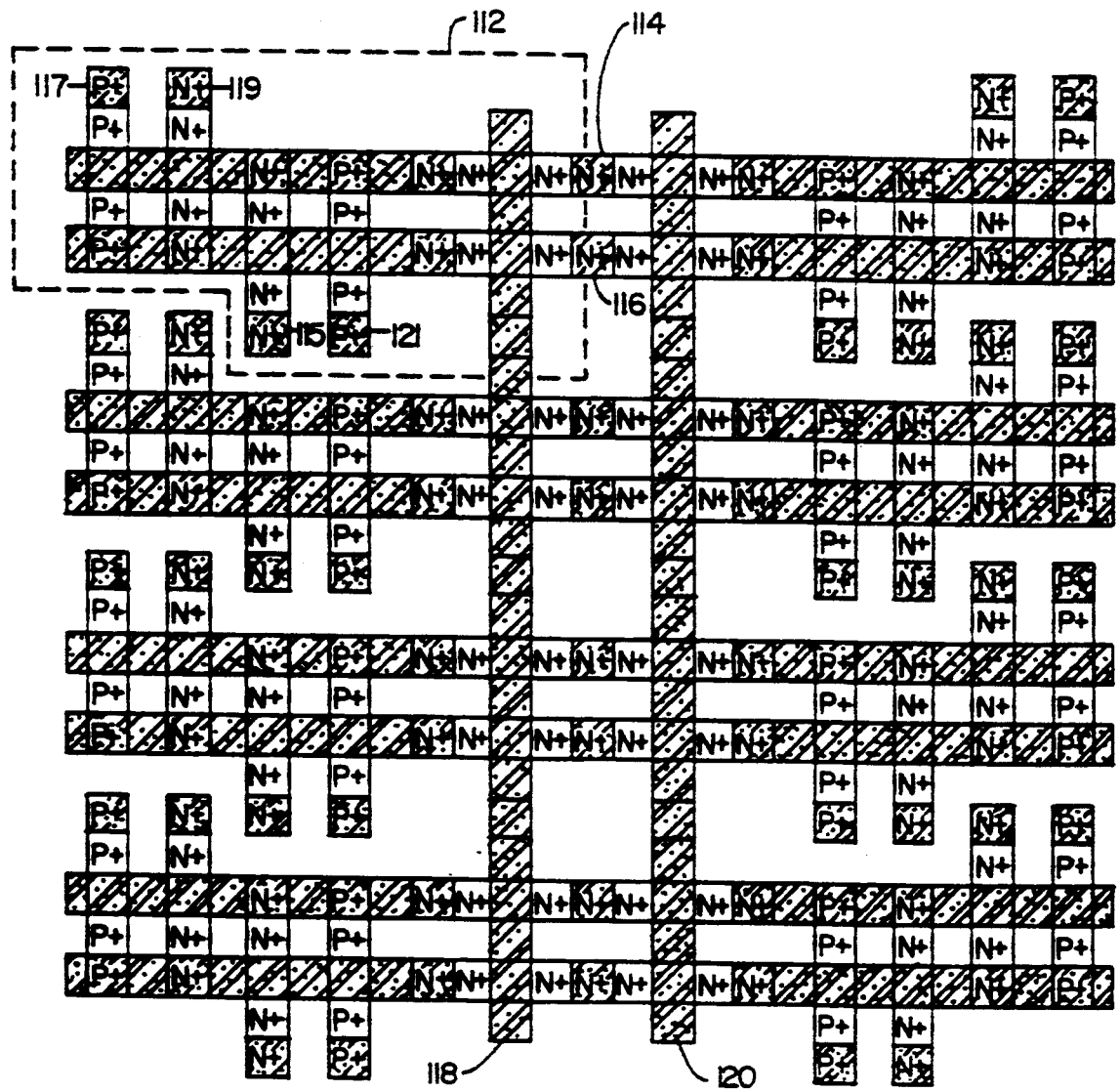
FIG. 26 illustrates one embodiment for the layout of an array of the cells of FIG. 23.

FIG. 26 shows one configuration for an array of the memory cell of FIG. 26. The line 112 in phantom outlines one cell in the array. Note that the bit line contacts 114 and 116 are shared between cells on the same row, but the Vcc and ground terminals, 115, 117 and 119, 121 respectively, are not shared by any cell. The metal post technology described in the U.S. patent application incorporated herein by reference earlier is advantageously used to make contact between these bit line, Vcc and ground terminals and metal lines formed on top of one or more layers of planarized insulation formed over the cells. The word lines 118 and 120 are also shared by cells on the same column, and these word lines are implemented on the polysilicon level of the circuit.

Figure 27:
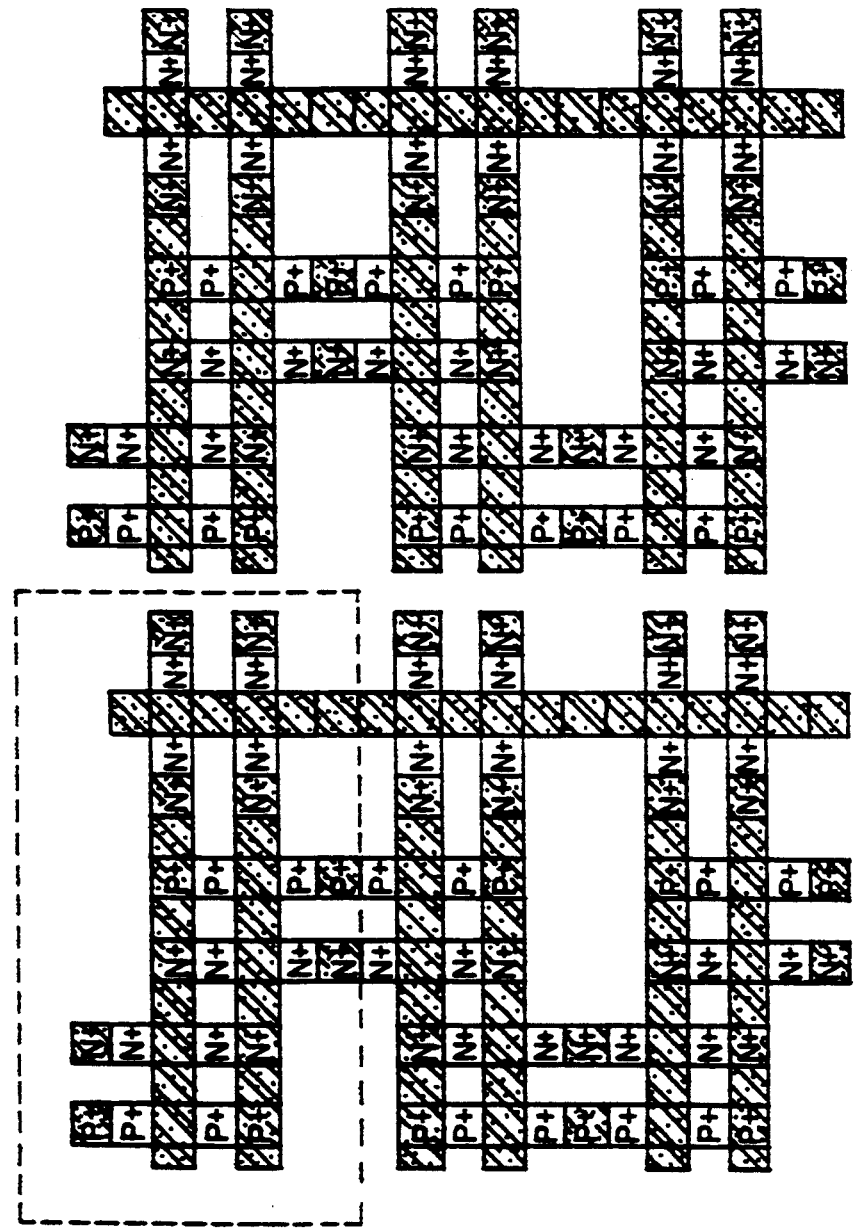
FIG. 27 illustrates another embodiment for the layout of an array of the cells of FIG. 23.

FIG. 27 illustrates another array configuration for the cells like the cell of FIG. 23. In this array, the word lines 118 and 120 are shared by cells in the same column, and each cell shares its Vcc and ground contacts with its neighboring cells above and below it in the same column. The bit lines are not shared however.

Figure 28:
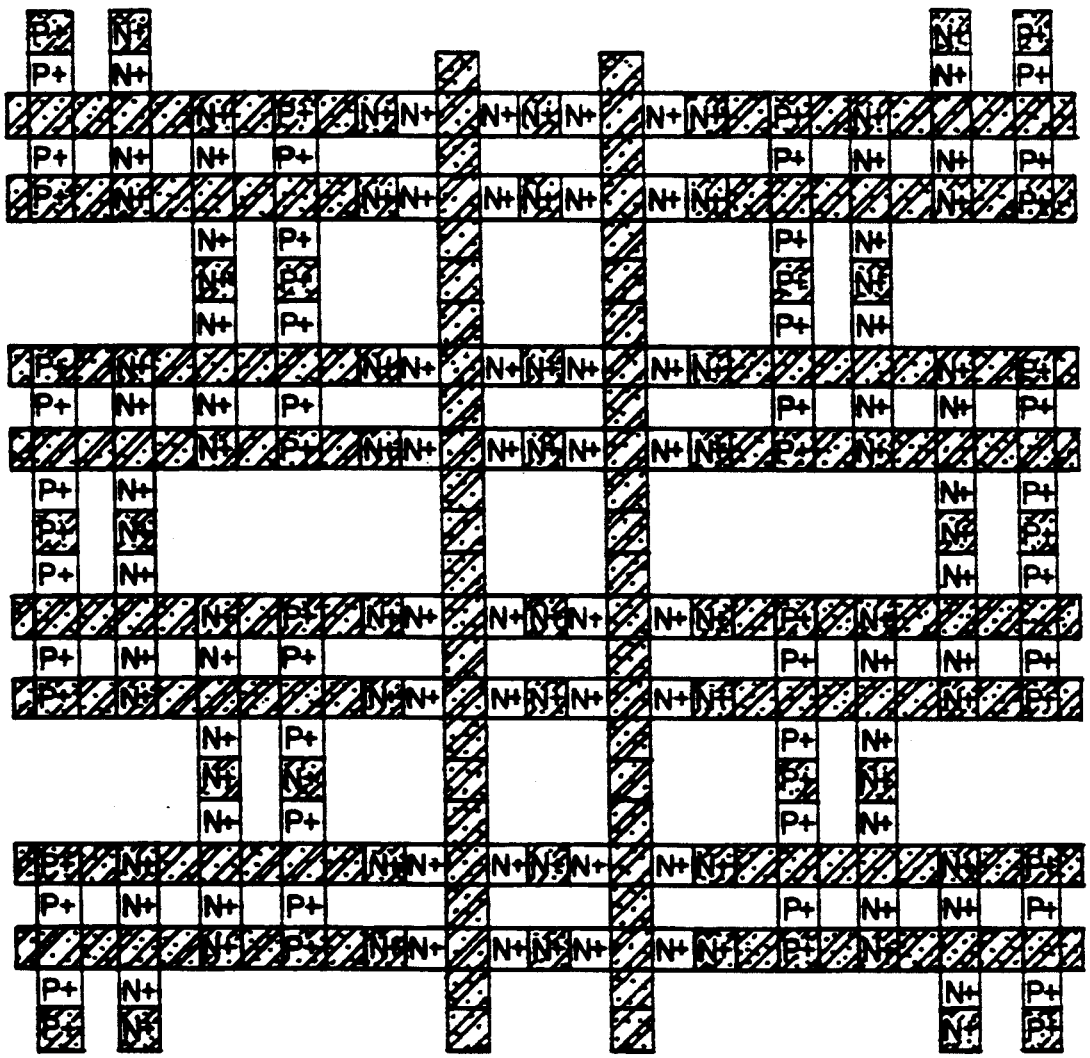
FIG. 28 illustrates the preferred embodiment for the layout of an array of the cells of FIG. 23.

FIG. 28 illustrates the preferred array configuration. In this array, the bit line contacts are shared by adjacent cells in the same row but different columns, while the Vcc and ground contacts are shared by each cell with the cells in the same column but adjacent rows on either side of the row of any particular cell. The word lines are also shared by all cells in the same column. With two micron design rules, 348 square microns are consumed by each cell.

Although the invention has been described in terms of the preferred embodiment and some alternative embodiments disclosed herein, it will be apparent to those skilled in the art that numerous modifications are possible. All such modifications are intended to be included within the scope of the claims appended hereto.

What is claimed is:

1. A process for forming MOS transistors and bipolar transistors on the same integrated circuit substrate comprising the steps of:

forming isolated islands of silicon of the proper conductivity for all bipolar and MOS transistors to be formed in said substrate;

forming a layer of gate insulating material over only the MOS islands and only over that portion of the MOS island over which the gate electrodes will be formed, and forming a plurality of transitory surface electrodes having top surfaces parallel to said substrate and side surfaces normal to substrate surface, said electrodes being formed out of the same layer of polysilicon which has been properly doped with the correct type of impurities in the regions where electrodes are to be formed, said electrodes to serve as the gate, source, drain, emitter, collector and base electrodes of the transistors being formed;

doping said substrate to form source and drain regions in electrical contact with said source and drain electrodes and aligned on one edge with the edges of said gate electrodes;

forming a layer of insulating material over all exposed portions of said silicon islands; and heating the structure long enough and at an appropriate temperature to cause out diffusion of impurities from said electrodes so as to form emitter regions and collector, source and drain contact regions in said substrate.

2. The process of claim 1 further comprising a step of forming a layer of silicide over said polysilicon electrodes and self-aligned with the edges thereof and wherein the step of doping said substrate includes the steps of doping the source and drain regions of MOS islands having N doped poly electrodes of N types to form an N channel transistor and doping the source and drain regions of MOS islands having P doped electrodes of P type to form a P channel transistor while simultaneously allowing the P type impurities to enter the substrate in bipolar NPN transistor islands.

3. A process of forming CMOS transistors and bipolar transistors on the same integrated circuit substrate in which there have been formed suitable buried layers, a layer of epitaxially grown silicon and electrically isolated regions of said epitaxially grown silicon, comprising the steps of:

doping the base regions and predetermined MOS active regions with impurities of a conductivity type selected to create the desired conductivity for a base region for selected types of bipolar transistor and for a channel region for a selected type of MOS transistor;

forming a gate oxide layer over a predetermined portion of all MOS isolation islands while preventing oxidation of the isolation regions for all bipolar devices;

depositing a layer of polysilicon over the surface of said substrate;

doping selected areas of said polysilicon with N type impurities and other selected areas with P type impurities;

etching the doped polysilicon area so as to form source and drain contacts and gate contacts for MOS devices and emitter, base and collector contacts for bipolar devices;

heating the structure for a time sufficient to form emitter regions and source, drain and collector contacts;

doping regions in said epitaxial layer adjacent the gate contacts of a first selected group of MOS devices with P type impurities and allowing said impurities to enter exposed regions of the substrate in all NPN bipolar transistor islands to lower the base resistance and doping regions in said epitaxial layer adjacent the gate contacts of a second selected group of MOS devices with N type impurities;

forming an insulating layer over the epitaxial silicon and the edges of the polysilicon contacts;

forming a layer of silicide over said polysilicon contacts and self-aligned with the edges thereof.

4. The process of claim 3 wherein the step of etching the doped polysilicon comprises the steps of:

depositing a layer of nitride over the polysilicon layer;

depositing a layer of photoresist on said nitride layer;

exposing selected areas of said photoresist to radiation through a mask to harden the resist in selected areas wherein the areas exposed are selected so as to leave nitride over the poly at the location of the emitter, base and collector contacts for the bipolar devices and the gate contact and the source and drain contacts of the MOS devices;

dissolving the unhardened resist;

etching away the nitride not protected by resist; and etching away the polysilicon not protected by nitride.

5. The process of claim 4 wherein the step of forming an insulating layer over the epitaxial silicon comprises the steps of:

thermally growing silicon dioxide in the regions exposed by the etching of the polysilicon;

removing the remaining nitride left over from the polysilicon etch step to expose the tops of the polysilicon contacts;

depositing a layer of refractory metal capable of forming a silicide on the structure;

heat treating the structure to form silicide wherever the metal is in contact with polysilicon; and removing the unreacted metal.

* * * * *

UNITED STATES PATENT AND TRADEMARK OFFICE
CERTIFICATE OF CORRECTION

PATENT NO. : 5,340,762

DATED : August 23, 1994

INVENTOR(S) : Vora

It is certified that error appears in the above-identified patent and that said Letters Patent is hereby corrected as shown below:

Column 21 and 22, claims 1-3 should read as follows:

1. A process for forming MOS transistors and bipolar transistors on the same integrated circuit substrate comprising the steps of:

forming isolated islands of silicon for all bipolar and MOS transistors to be formed in said substrate, said islands having a conductivity of one of either N type or P type;

forming a layer of gate insulating material over only the MOS islands and only over that portion of the MOS island over which the gate electrodes will be formed, and forming a plurality of transitory surface electrodes having top surfaces parallel to said substrate and side surfaces normal to substrate surface, said electrodes being formed out of the same layer of polysilicon which has been doped with impurities of one of either N type or P type in the regions where electrodes are to be formed, said electrodes to serve as the gate, source, drain, emitter, collector and base electrodes of the transistors being formed;

doping said substrate to form source and drain regions in electrical contact with said source and drain electrodes and aligned on one edge with the edges of said gate electrodes;

forming a layer of insulating material over all exposed portions of said silicon islands; and heating the structure long enough and at an appropriate temperature to cause out diffusion of impurities from said electrodes so as to form emitter regions and collector, source and drain contact regions in said substrate.

UNITED STATES PATENT AND TRADEMARK OFFICE
CERTIFICATE OF CORRECTION

PATENT NO. : 5,340,762

DATED : August 23, 1994

INVENTOR(S) : Vora

It is certified that error appears in the above-identified patent and that said Letters Patent is hereby corrected as shown below:

2. The process of claim 1 further comprising a step of forming a layer of silicide over said polysilicon electrodes and self-aligned with the edges thereof and wherein the step of doping said substrate includes the steps of doping the source and drain regions of MOS islands having N doped poly electrodes of N type to form an N channel transistor and doping the source and drain regions of MOS islands having P doped electrodes of P type to form a P channel transistor while simultaneously allowing the P type impurities to enter the substrate in bipolar NPN transistor islands.

3. A process of forming CMOS transistors and bipolar transistors on the same integrated circuit substrate in which there have been formed buried layers, a layer of epitaxially grown silicon and electrically isolated regions of said epitaxially grown silicon, comprising the steps of:

doping the base regions and predetermined MOS active regions with impurities of a conductivity type selected from either N type or P type to create a corresponding conductivity for a base region of a bipolar transistor and for a channel region for a MOS transistor;

forming a gate oxide layer over a portion of all MOS isolation islands while preventing oxidation of the isolation regions for all bipolar devices;

depositing a layer of polysilicon over the surface of said substrate;

doping first portions of said polysilicon with N type impurities and second portions of said polysilicon with P type impurities;

etching the first and second portions of doped polysilicon so as to form source and drain contacts and gate contacts for MOS devices and emitter, base and collector contacts for bipolar devices;

UNITED STATES PATENT AND TRADEMARK OFFICE
CERTIFICATE OF CORRECTION

PATENT NO. : 5,340,762

DATED : August 23, 1994

INVENTOR(S) : Vora

It is certified that error appears in the above-identified patent and that said Letters Patent is hereby corrected as shown below:

heating the structure to form emitter regions and source, drain and collector contacts;

doping regions in said epitaxial layer adjacent the gate contacts of a first group of MOS devices with P type impurities and allowing said impurities to enter exposed regions of the substrate in all NPN bipolar transistor islands to lower the base resistance and doping regions in said epitaxial layer adjacent the gate contacts of a second group of MOS devices with N type impurities;

forming an insulating layer over the epitaxial silicon and the edges of the polysilicon contacts;

forming a layer of silicide over said polysilicon contacts and self-aligned with the edges thereof.

Signed and Sealed this

Eleventh Day of April, 1995

*Attest:*

BRUCE LEHMAN

*Attesting Officer*      *Commissioner of Patents and Trademarks*